(12) United States Patent
Chen et al.

(10) Patent No.: US 12,538,510 B2
(45) Date of Patent: Jan. 27, 2026

(54) SEMICONDUCTOR DEVICE AND MANUFACTURING METHOD THEREOF

(71) Applicant: TAIWAN SEMICONDUCTOR MANUFACTURING COMPANY, LTD., Hsinchu (TW)

(72) Inventors: Chun-Yuan Chen, Hsinchu (TW); Meng-Huan Jao, Taichung (TW); Huan-Chieh Su, Changhua County (TW); Cheng-Chi Chuang, New Taipei (TW); Chih-Hao Wang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 738 days.

(21) Appl. No.: 17/742,265

(22) Filed: May 11, 2022

(65) Prior Publication Data

US 2023/0369468 A1   Nov. 16, 2023

(51) Int. Cl.
*H10D 30/01* (2025.01)
*H10D 30/62* (2025.01)
*H10D 64/01* (2025.01)
*H10D 84/01* (2025.01)
*H10D 84/03* (2025.01)

(52) U.S. Cl.
CPC ..... *H10D 30/0243* (2025.01); *H10D 30/6211* (2025.01); *H10D 30/6219* (2025.01); *H10D 64/021* (2025.01); *H10D 84/013* (2025.01); *H10D 84/0147* (2025.01); *H10D 84/0158* (2025.01); *H10D 84/038* (2025.01)

(58) Field of Classification Search
CPC ............. H10D 30/0243; H10D 64/252; H10D 84/013; H10D 84/0147; H10D 30/024; H10D 30/0223; H10D 30/6211; H10D 30/00; H10D 89/91; H10D 30/501–509; H10D 30/43–435; H10D 62/119–123; H10D 30/014; H10D 30/6219; H10D 84/017; H10D 30/0198; H10D 30/0295; H10D 30/6727; H10D 84/0186; Y10S 977/938; H01L 21/823481; H01D 84/0149
See application file for complete search history.

(56) References Cited

U.S. PATENT DOCUMENTS 9,209,247 B2   12/2015   Colinge et al.
9,236,267 B2   1/2016   De et al.
(Continued)

*Primary Examiner* — Julio J Maldonado
*Assistant Examiner* — Paul A Berry
(74) *Attorney, Agent, or Firm* — Maschoff Brennan

(57) ABSTRACT

A device includes a channel layer, a gate structure, a first source/drain epitaxial structure, a second source/drain epitaxial structure, a dummy fin structure, a mask layer, a first source/drain contact, and an isolation plug. The gate structure crosses the channel layer. The first source/drain epitaxial structure and the second source/drain epitaxial structure are on opposite sides of the channel layer. The dummy fin structure is in contact with the first source/drain epitaxial structure. The mask layer is over the dummy fin structure. The first source/drain contact is over and electrically connected to the first source/drain epitaxial structure. The isolation plug is over the mask layer and in contact with the first source/drain contact. The isolation plug is directly over the first source/drain contact and the mask layer.

20 Claims, 32 Drawing Sheets

(56) References Cited

U.S. PATENT DOCUMENTS

| | | | |
|---|---|---|---|
| 9,412,817 B2 | 8/2016 | Yang et al. | |
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 11,575,044 B2 * | 2/2023 | Bae | H10D 84/834 |
| 2019/0067446 A1 * | 2/2019 | Ching | H10D 84/0135 |
| 2019/0371673 A1 * | 12/2019 | Ching | H10D 62/116 |
| 2020/0119004 A1 * | 4/2020 | Ching | H10D 62/119 |
| 2020/0381307 A1 * | 12/2020 | Xie | H10D 84/834 |
| 2022/0157957 A1 * | 5/2022 | Jin | H10D 30/6219 |

\* cited by examiner

SEMICONDUCTOR DEVICE AND MANUFACTURING METHOD THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
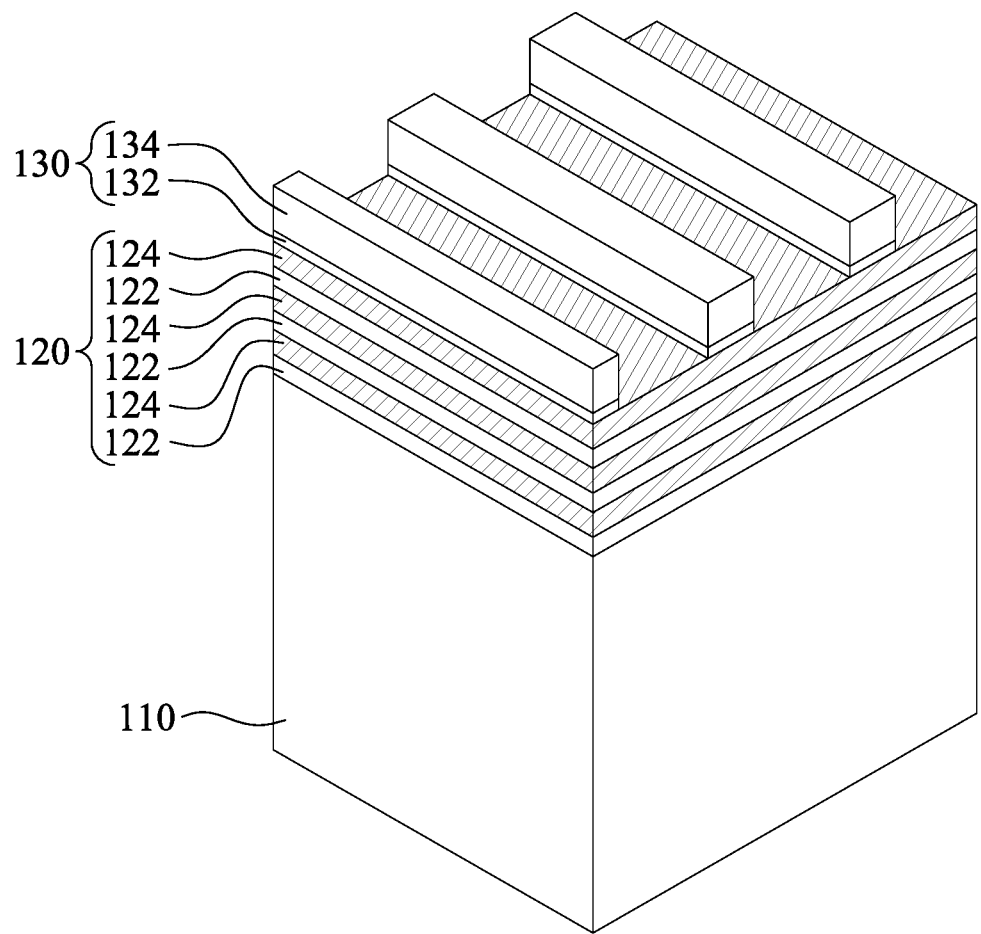
FIGS. 1-23E illustrate a method for manufacturing a semiconductor device (or an integrated circuit structure) at various stages in accordance with some embodiments of the present disclosure.
Figure 1:
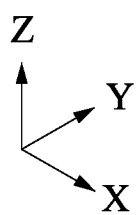

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated. One of ordinary skill in the art will appreciate that the dimensions may be varied according to different technology nodes. One of ordinary skill in the art will recognize that the dimensions depend upon the specific device type, technology generation, minimum feature size, and the like. It is intended, therefore, that the term be interpreted in light of the technology being evaluated.

As used herein, the term "etch selectivity" refers to the ratio of the etch rates of two different materials under the same etching conditions. As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9). As used herein, the term "low-k" refers to a low dielectric constant. In the field of semiconductor device structures and manufacturing processes, low-k refers to a dielectric constant that is less than the dielectric constant of $SiO_2$ (e.g., less than 3.9). As used herein, the term "p-type" defines a structure, layer, and/or region as being doped with p-type dopants, such as boron. As used herein, the term "n-type" defines a structure, layer, and/or region as being doped with n-type dopants, such as phosphorus. As used herein, the term "conductive" refers to an electrically conductive structure, layer, and/or region.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is related to semiconductor devices or integrated circuit structures) and methods of forming the same. More particularly, some embodiments of the present disclosure are related to semiconductor devices having an isolation plug for cutting adjacent source/drain contacts. The isolation plug is formed after the formation of the source/drain contacts to enlarge the size of the source/drain contacts.

FIGS. 1-23E illustrate a method for manufacturing a semiconductor device (or an integrated circuit structure) 100 at various stages in accordance with some embodiments of the present disclosure. In addition to the integrated circuit structure, FIGS. 1-16A, 17-22A, and 23A depict X-axis, Y-axis, and Z-axis directions. In some embodiments, the semiconductor device shown in FIGS. 1-23E may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

FIGS. 1-16A, 17-22A, and 23A are perspective views of some embodiments of the semiconductor device 100 at intermediate stages during fabrication. FIG. 23B is a cross-sectional view of some embodiments of the semiconductor device 100 during fabrication along a first cut (e.g., cut I-I), which is along a lengthwise direction of the channel (semiconductor layer). FIGS. 22B and 23C are cross-sectional views of some embodiments of the semiconductor device 100 during fabrication along a second cut (e.g., cut II-II), which is along a lengthwise direction of the dummy fin structure. FIG. 23D is a cross-sectional view of some embodiments of the semiconductor device 100 during fabrication along a third cut (e.g., cut III-III), which is in source/drain regions and perpendicular to the lengthwise direction of the channel. FIGS. 16B and 23E are cross-sectional views of some embodiments of the semiconductor device 100 at intermediate stages during fabrication along a fourth cut (e.g., cut IV-IV), which is in the gate regions and perpendicular to the lengthwise direction of the channel.

Reference is made to FIG. 1. A substrate 110, which may be a part of a wafer, is provided. In some embodiments, the substrate 110 may include silicon (Si). Alternatively, the substrate 110 may include germanium (Ge), silicon germanium (SiGe), gallium arsenide (GaAs) or other appropriate semiconductor materials. In some embodiments, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or another appropriate method. In various embodiments, the substrate 110 may include any of a variety of substrate structures and materials.

A semiconductor stack 120 is formed on the substrate 110 through epitaxy, such that the semiconductor stack 120 forms crystalline layers. The semiconductor stack 120 includes semiconductor layers 122 and 124 stacked alternatively. There may be two, three, four, or more of the semiconductor layers 122 and 124. The semiconductor layers 122 can be SiGe layers. In some embodiments, the germanium percentage of the semiconductor layers 122 is in the range between about 10 percent and about 60 percent. In some embodiments, the thickness of the semiconductor layers 122 is in the range between about 3 nm and about 15 nm.

The semiconductor layers 124 may be pure silicon layers that are free from germanium. The semiconductor layers 124 may also be substantially pure silicon layers, for example, with a germanium percentage lower than about 1 percent. Furthermore, the semiconductor layers 124 may be intrinsic, which are not doped with p-type and n-type impurities. In some embodiments, the thickness of the semiconductor layers 124 is in the range between about 3 nm and about 15 nm. In some other embodiments, however, the semiconductor layers 124 can be silicon germanium or germanium for p-type semiconductor device, or can be III-V materials, such as InAs, InGaAs, InGaAsSb, GaAs, InPSb, or other suitable materials.

The semiconductor layers 124 or portions thereof may form nanostructure channel(s) of the nanostructure transistor. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. For example, the nanostructures are nanosheets, nanowires, nanoslabs, or nanorings, depending on their geometry. The use of the semiconductor layers 124 to define a channel or channels of a device is further discussed below.

As described above, the semiconductor layers 124 may serve as channel region(s) for a subsequently-formed semiconductor device and the thickness is chosen based on device performance considerations. The semiconductor layers 122 in channel regions(s) may eventually be removed and serve to define a vertical distance between adjacent channel region(s) for a subsequently-formed multi-gate device and the thickness is chosen based on device performance considerations. Accordingly, the semiconductor layers 122 may also be referred to as sacrificial layers, and semiconductor layers 124 may also be referred to as channel layers.

A patterned hard mask 130 is formed over the semiconductor stack 120. The patterned hard mask 120 covers a portion of the semiconductor stack 120 while leaves another portion of the semiconductor stack 120 uncovered. In some embodiments, the patterned hard mask 130 includes an oxide layer 132 (e.g., a pad oxide layer that may include $SiO_2$) and a nitride layer 134 (e.g., a pad nitride layer that may include $Si_3N_4$) formed over the oxide layer. The oxide layer 132 may act as an adhesion layer between the semiconductor stack 120 and the nitride layer 134 and may act as an etch stop layer for etching the nitride layer 134. In some examples, the oxide layer 132 includes thermally grown oxide, chemical vapor deposition (CVD)-deposited oxide, and/or atomic layer deposition (ALD)-deposited oxide. In some embodiments, the nitride layer 134 is deposited on the oxide layer 132 by CVD and/or other suitable techniques.

Figure 2:
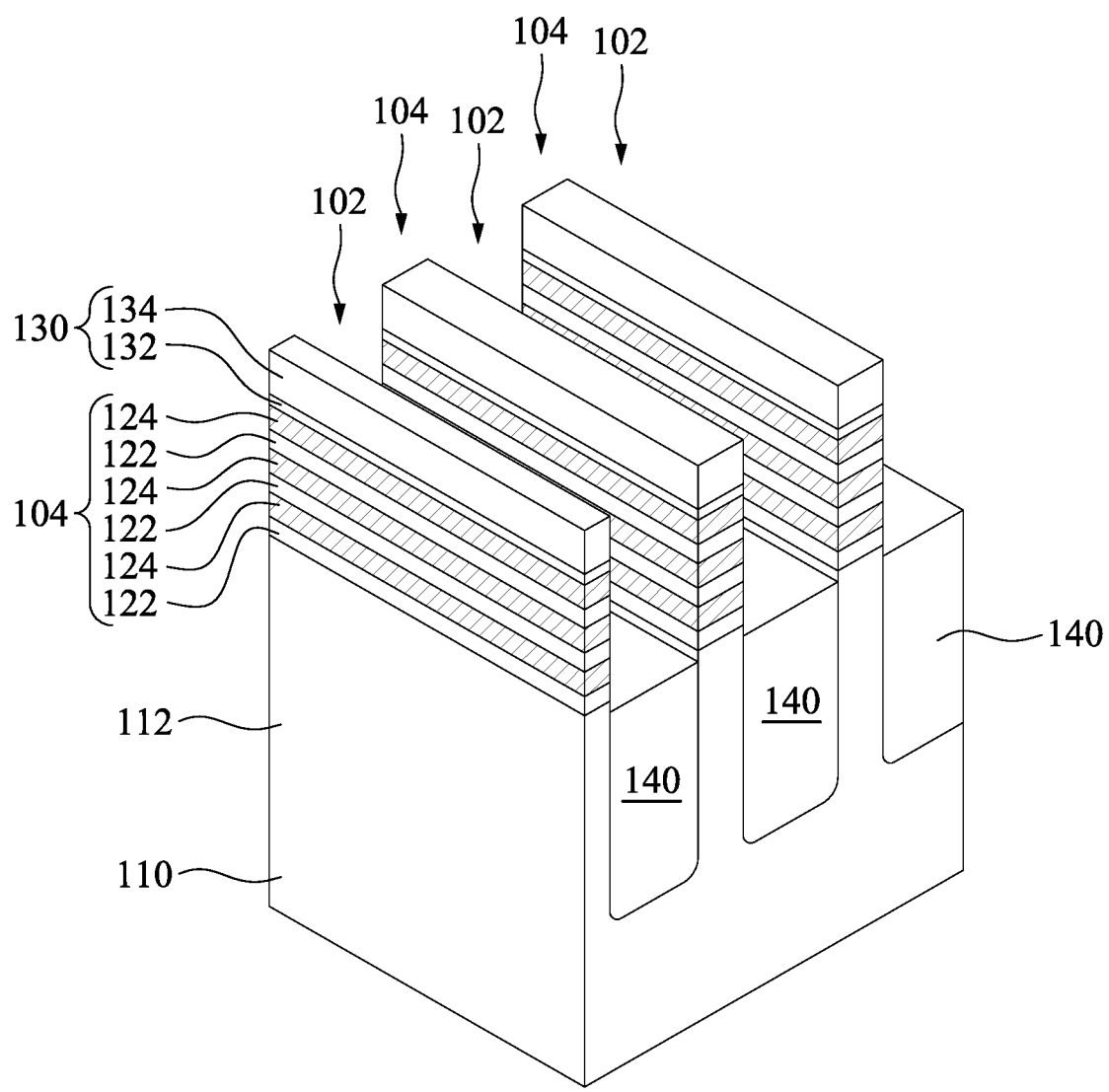

Reference is made to FIG. 2. The semiconductor stack 120 and the substrate 110 of FIG. 1 are patterned using the patterned hard mask 130 as a mask to form trenches 102. Accordingly, a plurality of active fin structures (or semiconductor strips) 104 are formed. The trenches 102 extend into the substrate 110, and have lengthwise directions substantially parallel to each other. The trenches 102 form base portions 112 in the substrate 110, where the base portions 112 protrude from the substrate 110, and the active fin structures 104 are respectively formed above the base portions 112 of the substrate 110. The remaining portions of the semiconductor stack 120 are accordingly referred to as the active fin structures 104 alternatively.

Isolation structures 140, which may be shallow trench isolation (STI) regions, are formed in the trenches 102. The formation may include filling the trenches 102 with a dielectric layer(s), for example, using flowable chemical vapor deposition (FCVD), and performing a chemical mechanical polish (CMP) to level the top surface of the dielectric material with the top surface of the hard mask 130. The isolation structures 140 are then recessed. The top surface of the resulting isolation structures 140 may be level with or slightly lower than the top surface of the base portions 112 of the substrate 110. The isolation structures 140 may be a dielectric material, such as silicon oxide, silicon nitride, silicon oxynitride, SiCN, $SiC_xO_yN_z$, or combinations thereof.

Figure 3:
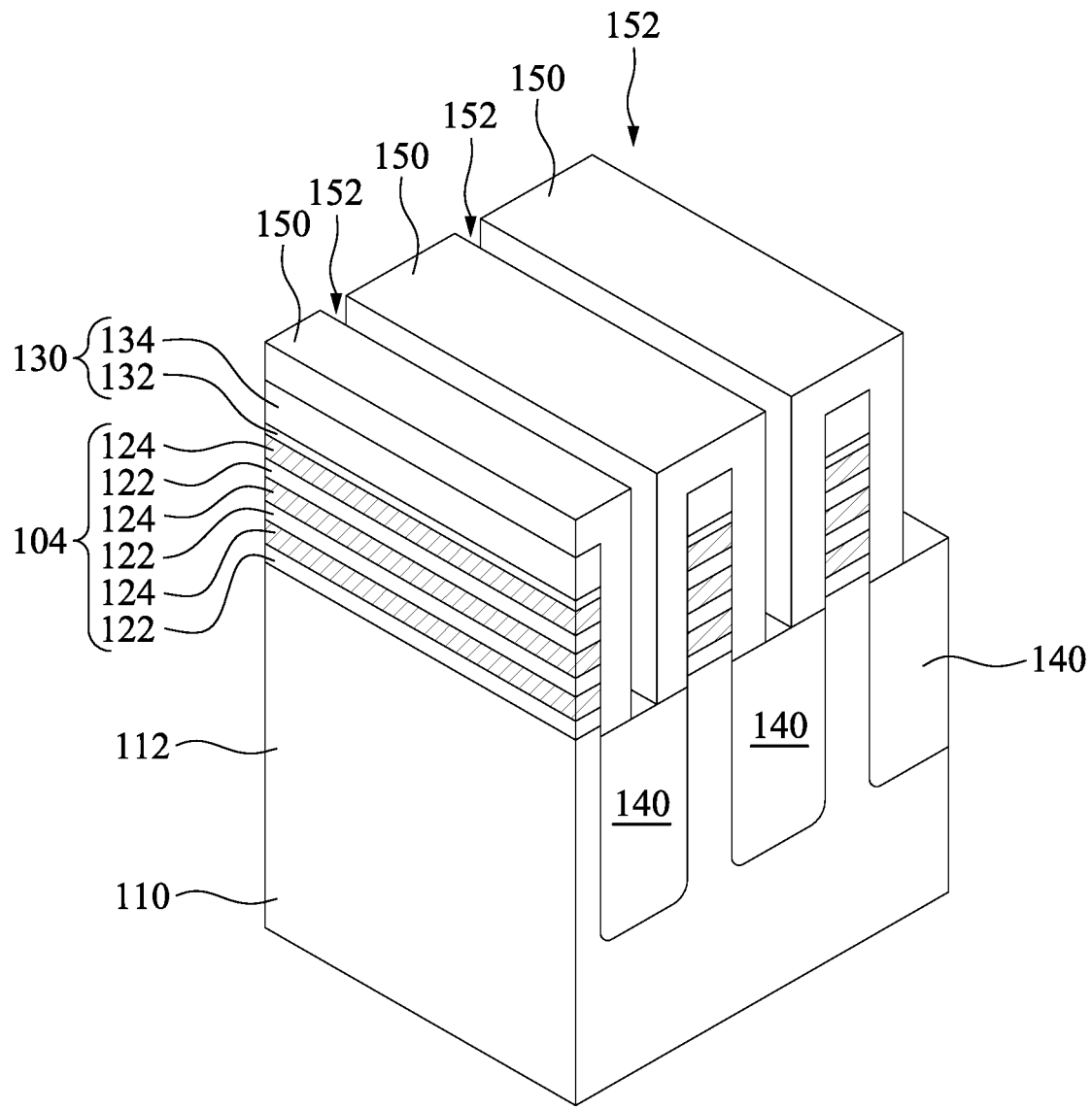

Reference is made to FIG. 3. Cladding layers 150 are formed above the isolation structures 140 and respectively cover the active fin structures 104. In some embodiments, the cladding layers 150 are made of semiconductor materials, such as SiGe or other suitable materials. In some embodiments, the cladding layers 150 and the semiconductor layers 122 may have substantially the same or similar materials/components, such the cladding layers 150 and the semiconductor layers 152 have similar etching rates under the same etchant. The cladding layers 150 are separated from each other, such that trenches 152 are formed therebetween.

Figure 4:
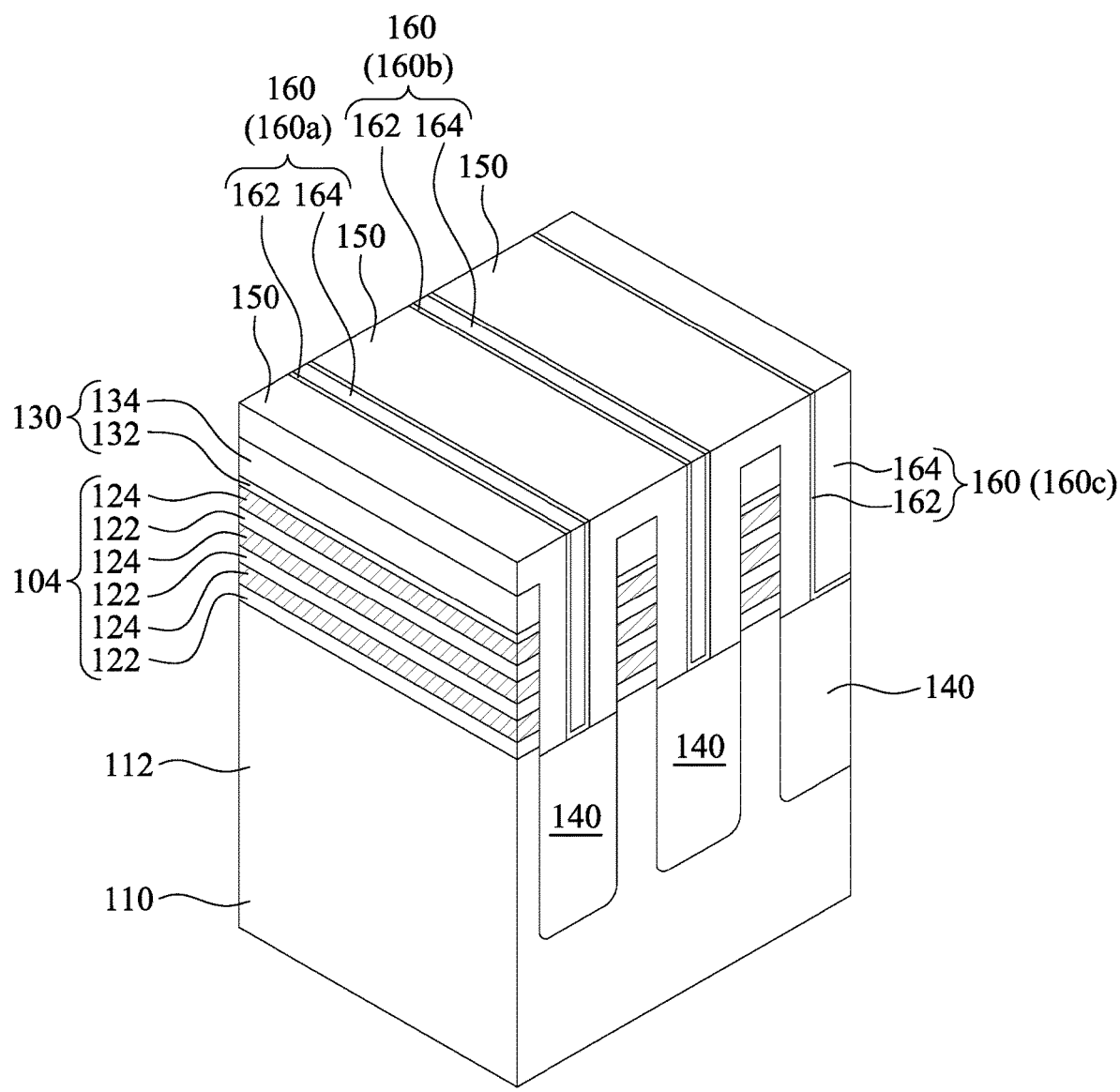

Reference is made to FIG. 4. A plurality of dummy fin structures 160 are respectively formed in the trenches 152 (see FIG. 3). In some embodiments, a dielectric layer is conformally formed above the structure in FIG. 3, and a filling material is filled in the trenches 152. A planarization (e.g., CMP) process is then performed to remove excess portions of the dielectric layer and the filling material to form the dummy fin structures 160 respectively in the trenches 152. As such, each of the dummy fin structures 160 includes a dielectric layer 162 and a dummy fin 164 above the dielectric layer 162. In some embodiments, the dielectric layer 162 is deposited with an ALD process or other suitable processes. In some embodiments, the dielectric layer 162 and the dummy fin 164 include silicon nitride, silicon oxide, silicon oxynitride, SiCN, SiOCN, SiOC, or other suitable materials. For example, the dielectric layer 162 includes silicon nitride, and the dummy fin includes silicon dioxide.

In some embodiments, the dummy fin structures 160 have different widths as shown in FIG. 4. For example, the dummy fin structure 160c has a width greater than that of the dummy fin structures 160a and 160b. The sizes of the dummy fin structures 160 may depend on the layout positions thereof. For example, the dummy fin structure 160c may be disposed on a cell boundary, which may be a place to put power lines (e.g., VDD and/or VSS), while the dummy fin structures 160a and 160b may be disposed in a cell.

Figure 5:
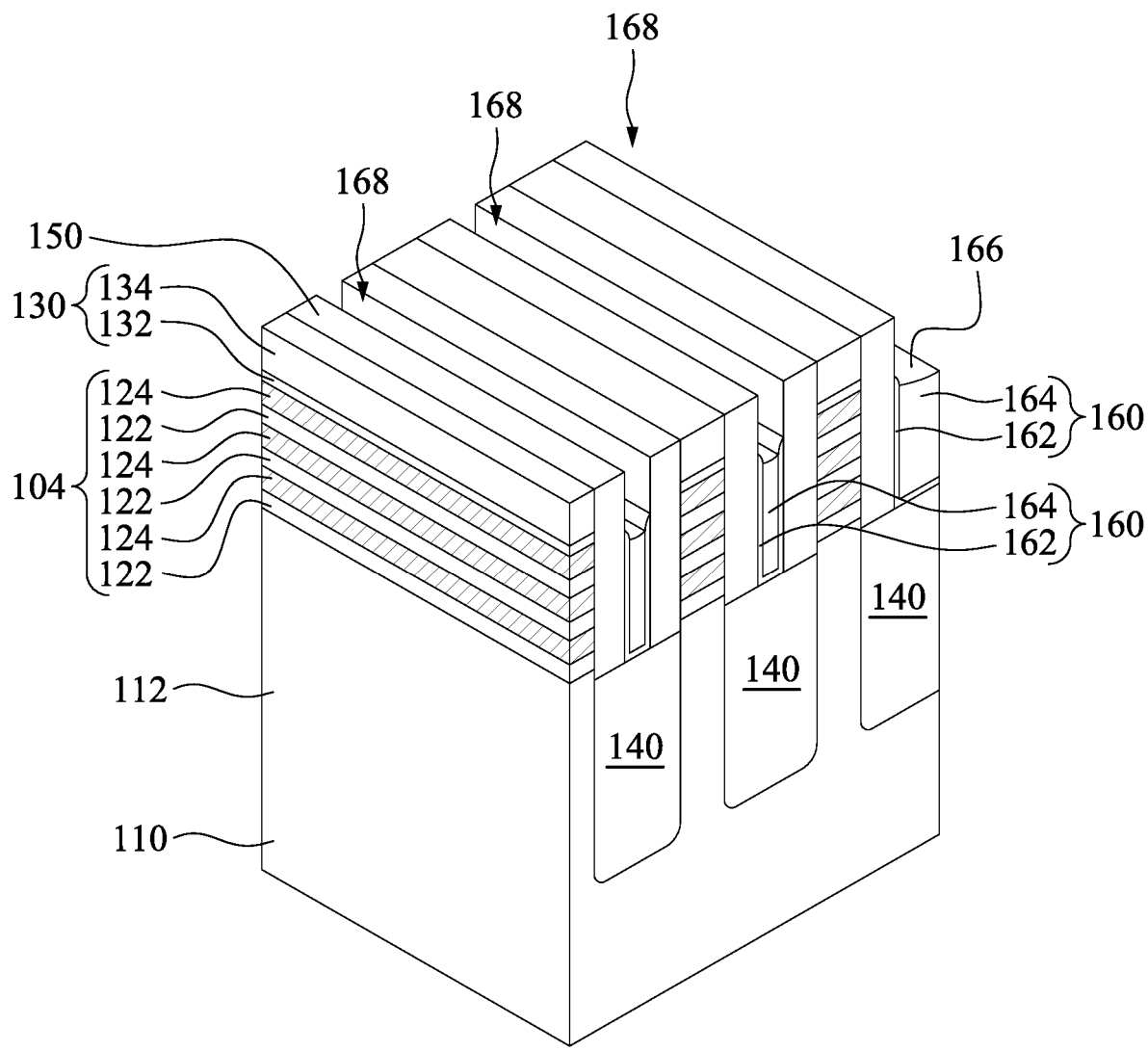

Reference is made to FIG. 5. The dummy fin structures 160 are recessed to form recesses 168 thereon. In some embodiments, multiple etching processes are performed to recess the dummy fin structures 160. The etching processes include dry etching process, wet etching process, or combinations thereof. In some embodiments, during the recessing of the dummy fin structures 160, top portions of the cladding layers 160 are removed to expose the hard mask 130. In some embodiments, a top surface 166 of the dummy fin structures 160 is substantially level with the top surface of the topmost semiconductor layer 124, or may be at an intermediate level between the top surface and the bottom surface of the topmost semiconductor layer 124.

In some embodiments, since the dielectric layer 162 and the dummy fin 164 are made of different materials, the etching rate of the dielectric layer 162 and the dummy fin 164 are different. As such, a top surface of the dielectric layer 162 is not coplanar with a top surface of the dummy fin 164. For example, a top surface of the dielectric layer 162 is higher than a top surface of the dummy fin 164. That is, the dielectric layer 162 may protrude from the dummy fin 164. Further, the top surface of the dielectric layer 162 may be convex.

Figure 6:
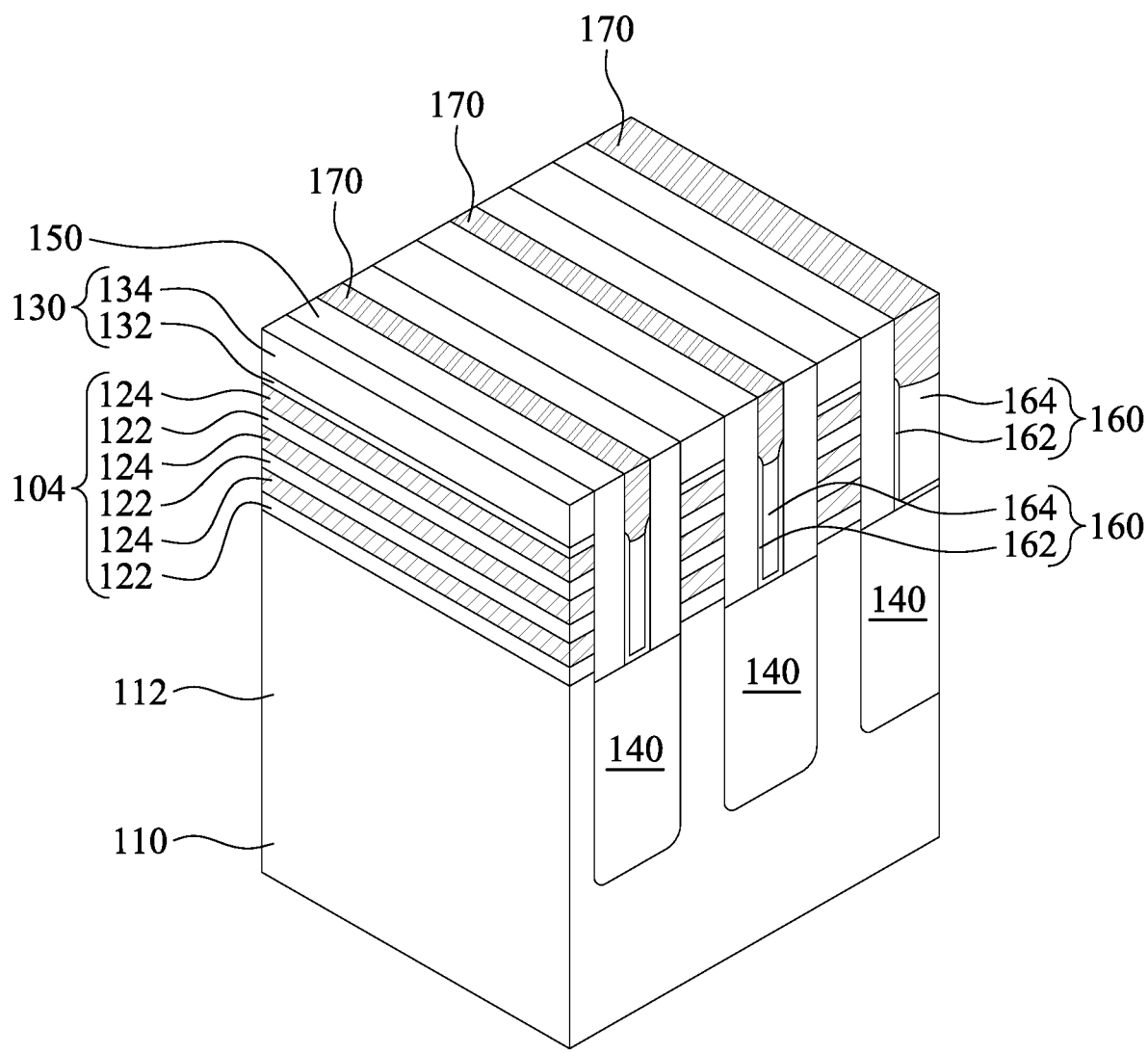

Reference is made to FIG. 6. Mask layers 170 are respectively formed in the recesses 168 (see FIG. 5). In some embodiments, the mask layers 170 are formed of SiOCN. In some other embodiments, the mask layers 170 are made of high-k materials include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), oxynitrides (SiON), and combinations thereof. In some embodiments, a mask material is formed above the structure of FIG. 5, and a planarization (e.g., CMP) process is performed to remove excess portion of the mask material to form the mask layers 170.

Figure 7:
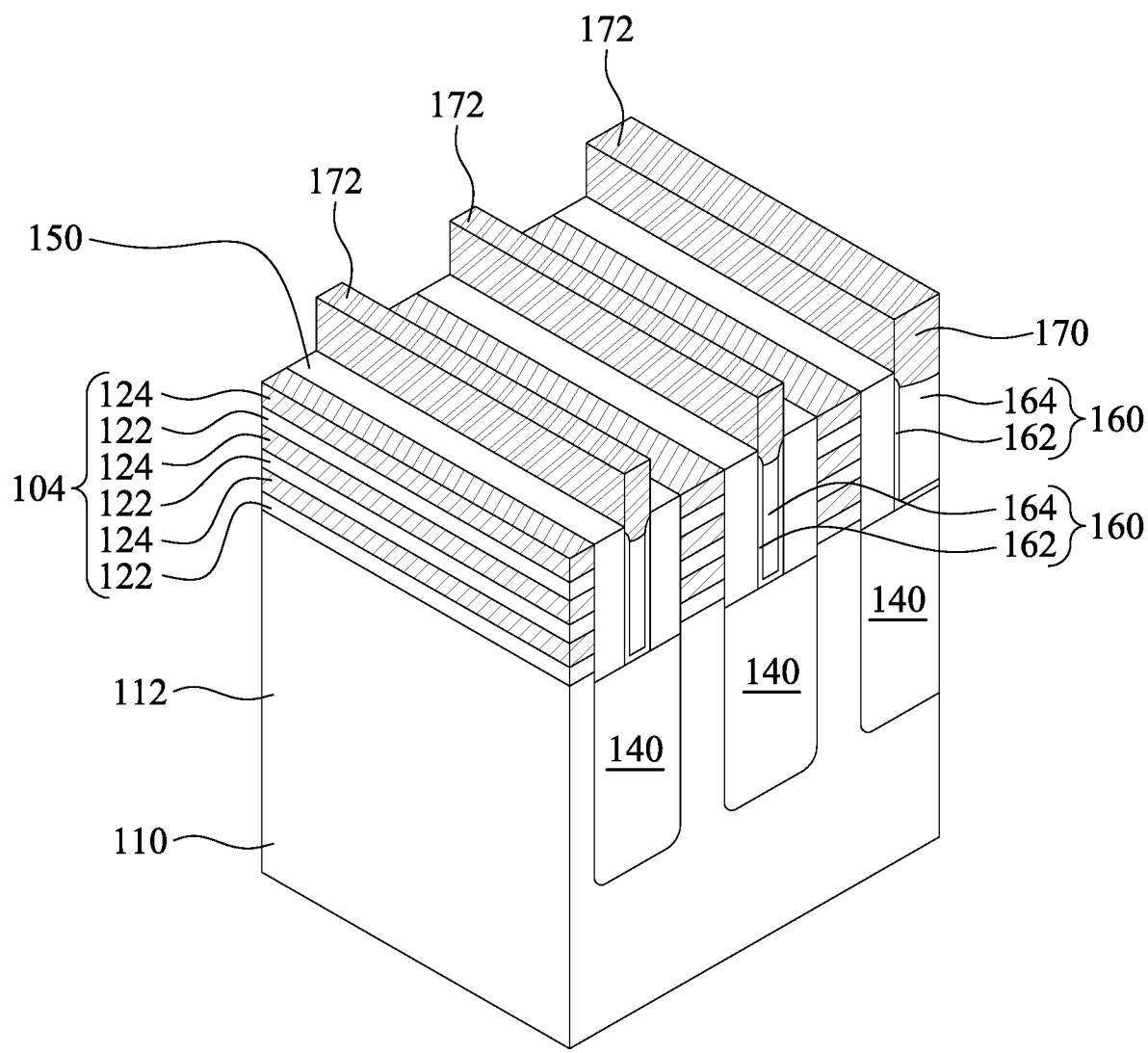

Reference is made to FIG. 7. The patterned hard masks 130 (see FIG. 6) are removed, and portions of the cladding layers 150 above top surfaces of the topmost semiconductor layer 124 are removed as well. As such, top surfaces of the cladding layers 150 are lower than the top surfaces 172 of the mask layers 170. In some embodiments, multiple etching processes are performed to etch back the cladding layers 150 and remove the hard masks 130. The etching processes include dry etching process, wet etching process, or combinations thereof.

Figure 8:
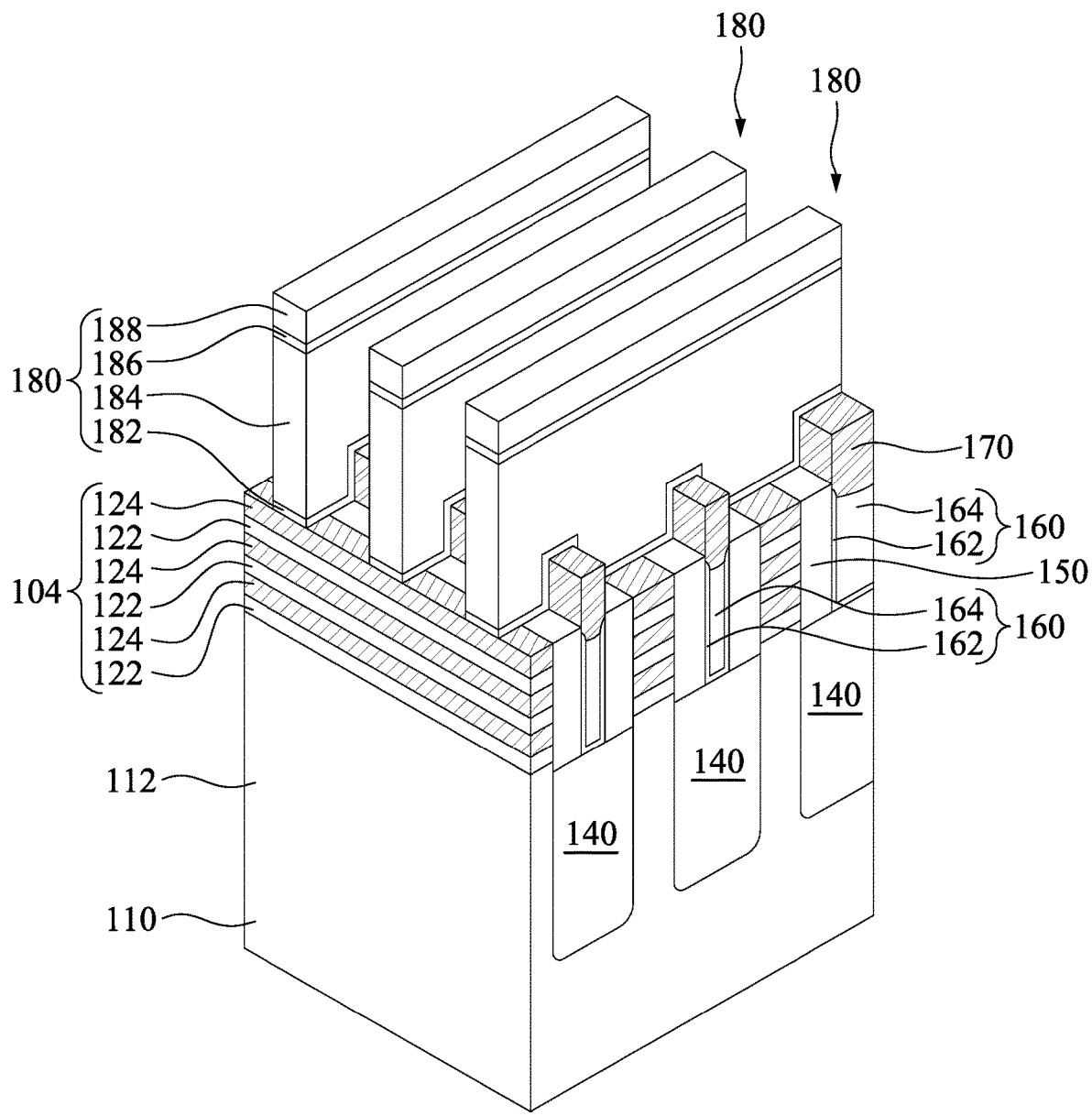

Reference is made to FIG. 8. Dummy gate structures 180 are formed over the substrate 110 and are at least partially disposed over the active fin structures 104. The portions of the active fin structures 104 underlying the dummy gate structures 180 may be referred to as the channel region. The dummy gate structures 180 may also define source/drain (S/D) regions of the active fin structures 104, for example, the regions of the active fin structures 104 adjacent and on opposing sides of the channel regions.

Dummy gate formation operation first forms a dummy gate dielectric layer 182 over the active fin structures 104. Subsequently, a dummy gate electrode layer 184 and a hard mask which may include multiple layers 186 and 188 (e.g., an oxide layer 186 and a nitride layer 188) are formed over the dummy gate dielectric layer 182. The hard mask is then patterned, followed by patterning the dummy gate electrode layer 182 by using the patterned hard mask as an etch mask. In some embodiments, after patterning the dummy gate electrode layer 184, the dummy gate dielectric layer 182 is removed from the S/D regions of the active fin structures 104. The etch process may include a wet etch, a dry etch, and/or a combination thereof. The etch process is chosen to selectively etch the dummy gate dielectric layer 182 without substantially etching the active fin structures 104, the dummy gate electrode layer 184, the oxide mask layer 186 and the nitride mask layer 188.

Figure 9:
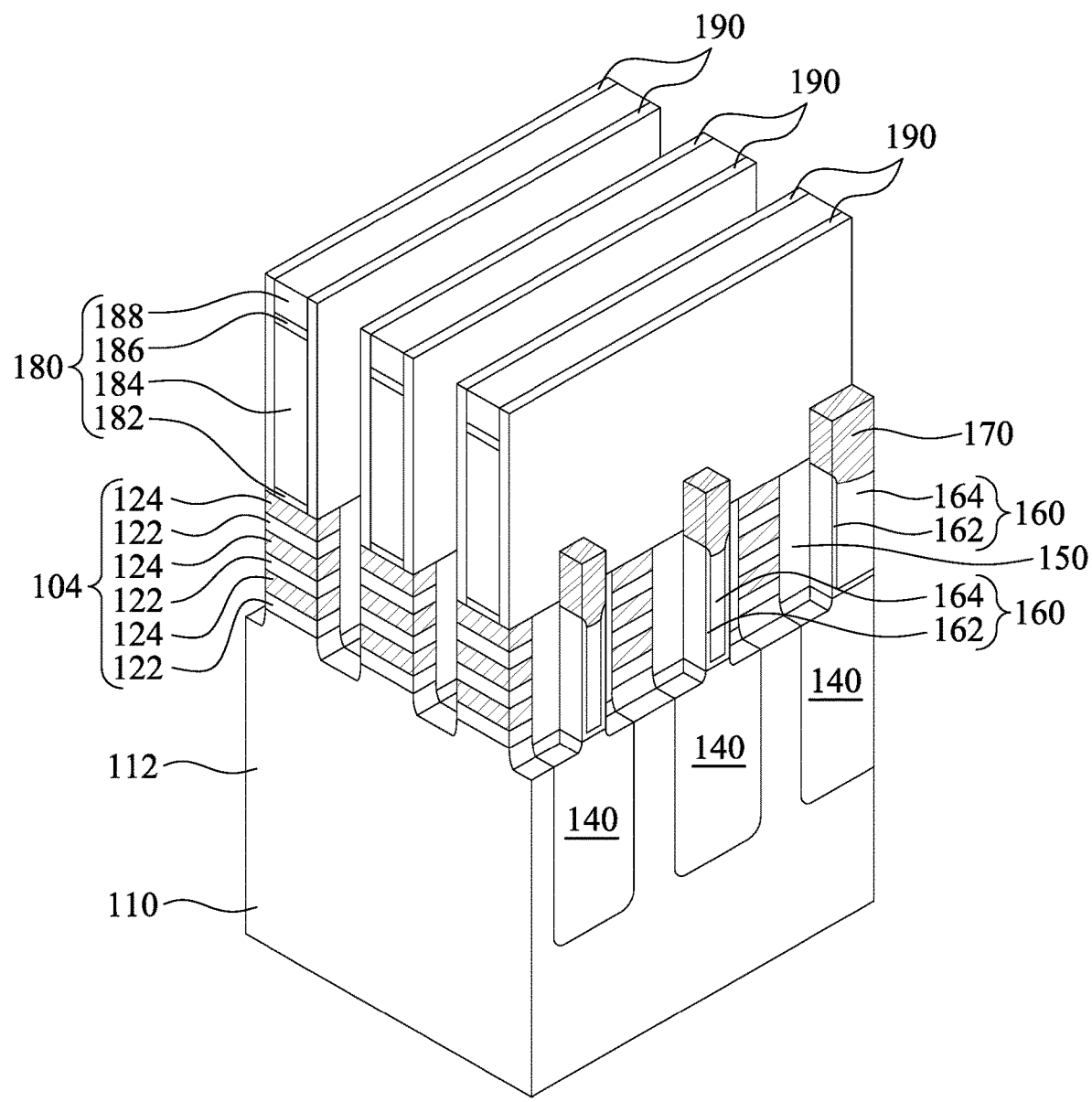

Reference is made to FIG. 9. Gate spacers 190 are respectively formed on sidewalls of the dummy gate structure 180. The gate spacers 190 may include a seal spacer and a main spacer (not shown). The gate spacers 190 include one or more dielectric materials, such as silicon oxide, silicon nitride, silicon oxynitride, SiCN, SiCxOyNz, or combinations thereof. The seal spacers are formed on sidewalls of the dummy gate structure 180 and the main spacers are formed on the seal spacers. The gate spacers 190 can be formed using a deposition method, such as plasma enhanced chemical vapor deposition (PECVD), low-pressure chemical vapor deposition (LPCVD), sub-atmospheric chemical vapor deposition (SACVD), or the like. The formation of the gate spacers 190 may include blanket forming spacer layers, and then performing etching operations to remove the horizontal portions of the spacer layers. The remaining vertical portions of the gate spacer layers form the gate spacers 190.

Subsequently, the active fin structures 104 and the cladding layers 150 are further patterned using the dummy gate structure 180 and the gate spacers 190 as masks, such that portions of the isolation structures 140 and the base portions 112 of the substrate 110 are exposed. In some embodiments, the patterning process is performed with an anisotropic dry etch process. In some embodiments, the dry etch process etches the active fin structures 104 and the cladding layers 150 (e.g., Si and SiGe) much faster than etching the mask layers 170 (e.g., high-k materials). Due to this etch selectivity, the dry etch process patterns the active fin structures 104 and the cladding layers 150 vertically without complete etching the mask layers 170. In some embodiments, the base portions 112 and the isolation structures 140 are also recessed in this etch process as shown in FIG. 9.

Figure 10:
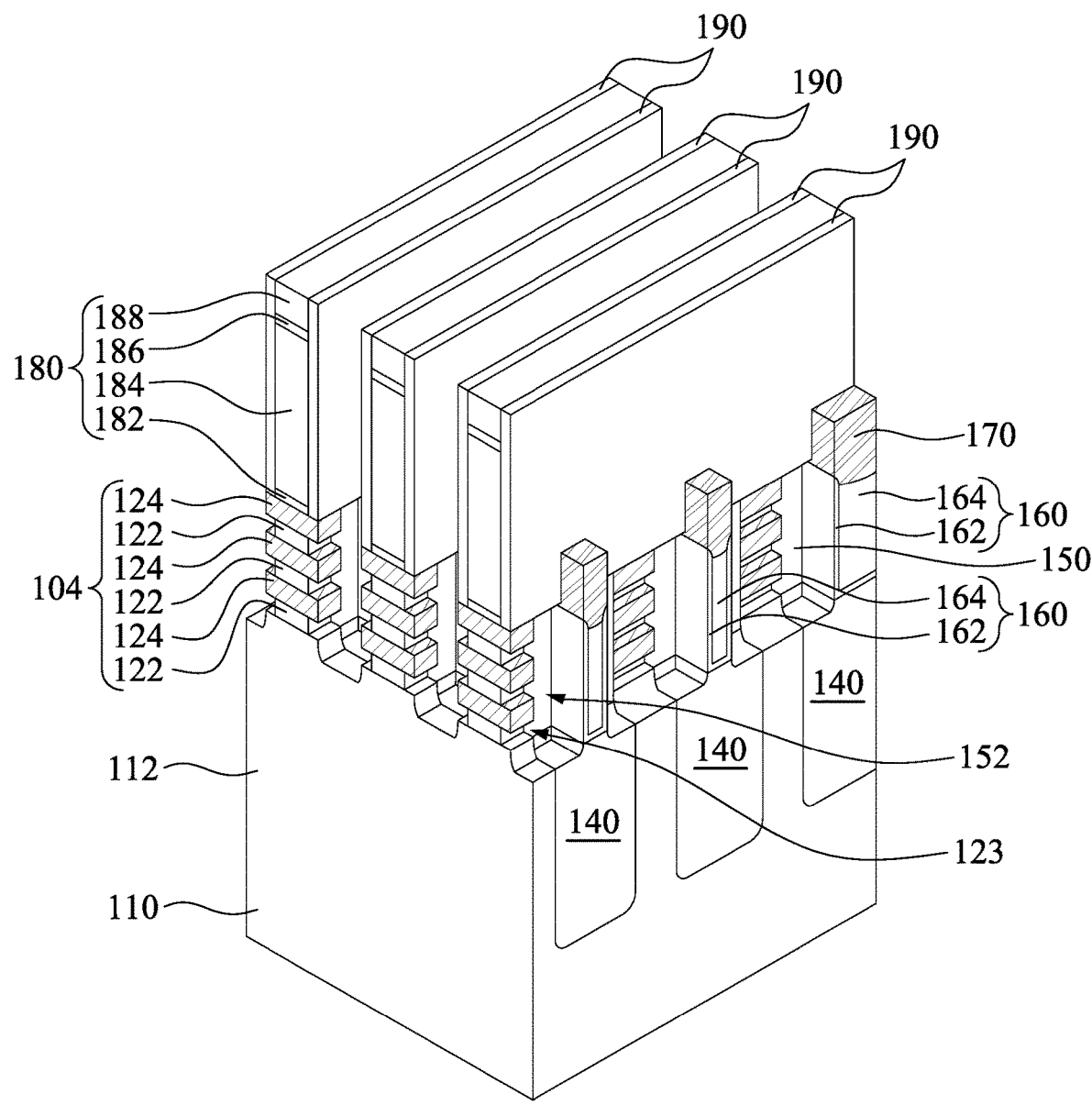

Reference is made to FIG. 10. The semiconductor layers 122 and the cladding layers 150 are horizontally recessed (etched) so that edges of the semiconductor layers 122 and the cladding layers 150 are located substantially below the gate spacers 190 and recesses 123 and 152 are formed. The etching of the semiconductor layers 122 and the cladding layers 150 includes wet etching and/or dry etching. A wet etchant such as a tetramethylammonium hydroxide (TMAH) solution can be used to selectively etch the semiconductor layers 122 and the cladding layers 150.

Figure 11:
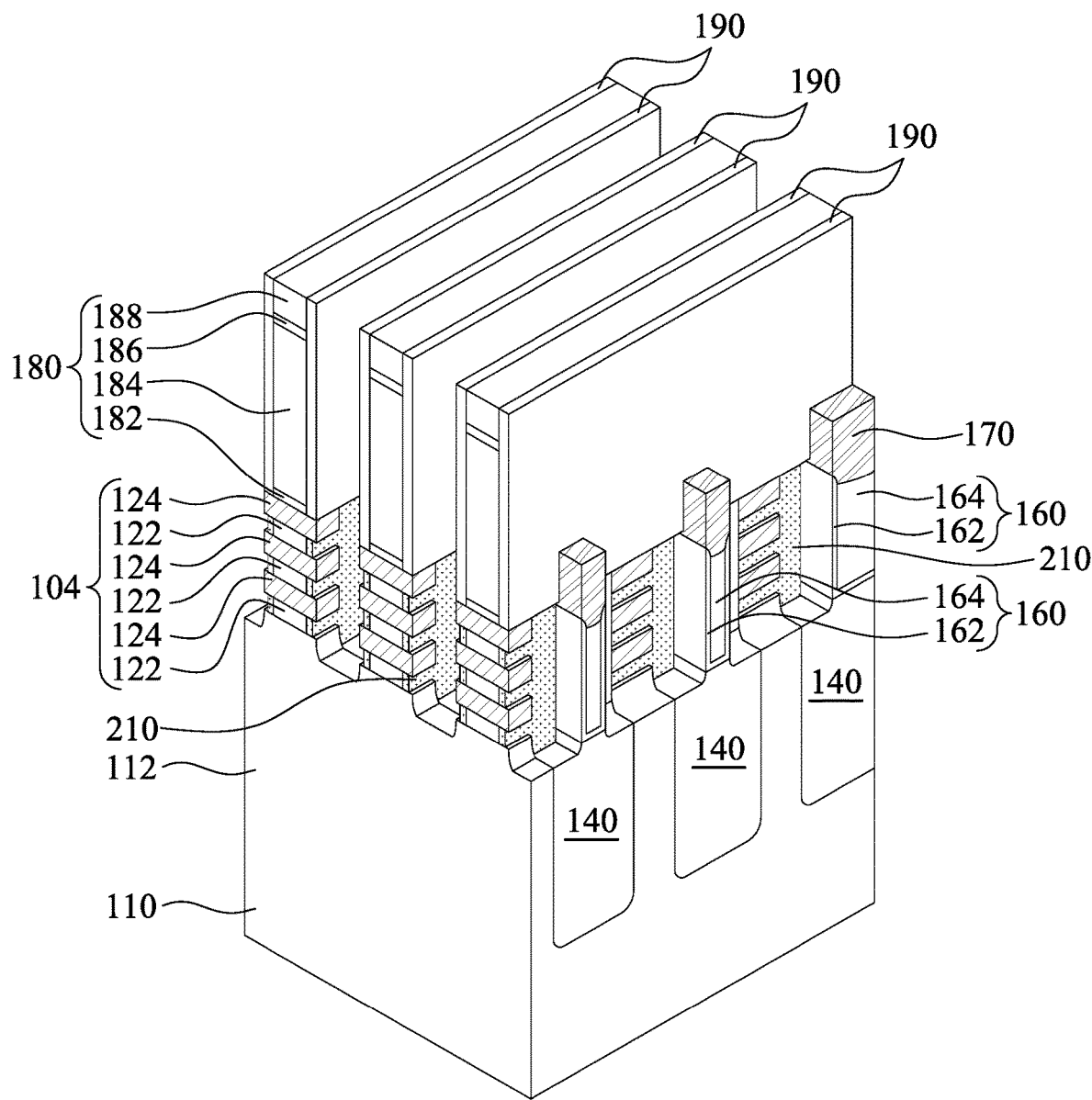

Reference is made to FIG. 11. Inner sidewall spacers 210 are respectively formed in the recesses 123 and 152 (see FIG. 10) of the semiconductor layers 122 and the cladding layers 150. For example, a dielectric material layer is formed over the structure of FIG. 10, and one or more etching operations are performed to form the inner sidewall spacers 210. In some embodiments, the inner sidewall spacers 210 includes a silicon nitride-based material, such as SiN, SiON, SiOCN or SiCN and combinations thereof and is different from the material of the gate spacers 190. In some embodiments, the inner sidewall spacers 210 are silicon nitride. The inner sidewall spacers 210 may not fully fill the recesses 122 and 152 as shown in FIG. 11. Therefore, the semiconductor layers 124 may protrude from the inner sidewall spacers 210. The dielectric material layer can be formed using CVD, including LPCVD and PECVD, PVD, ALD, or other suitable processes. The etching operations include one or more wet and/or dry etching operations. In some embodiments, the etching is an isotropic etching in some embodiments.

Figure 12:
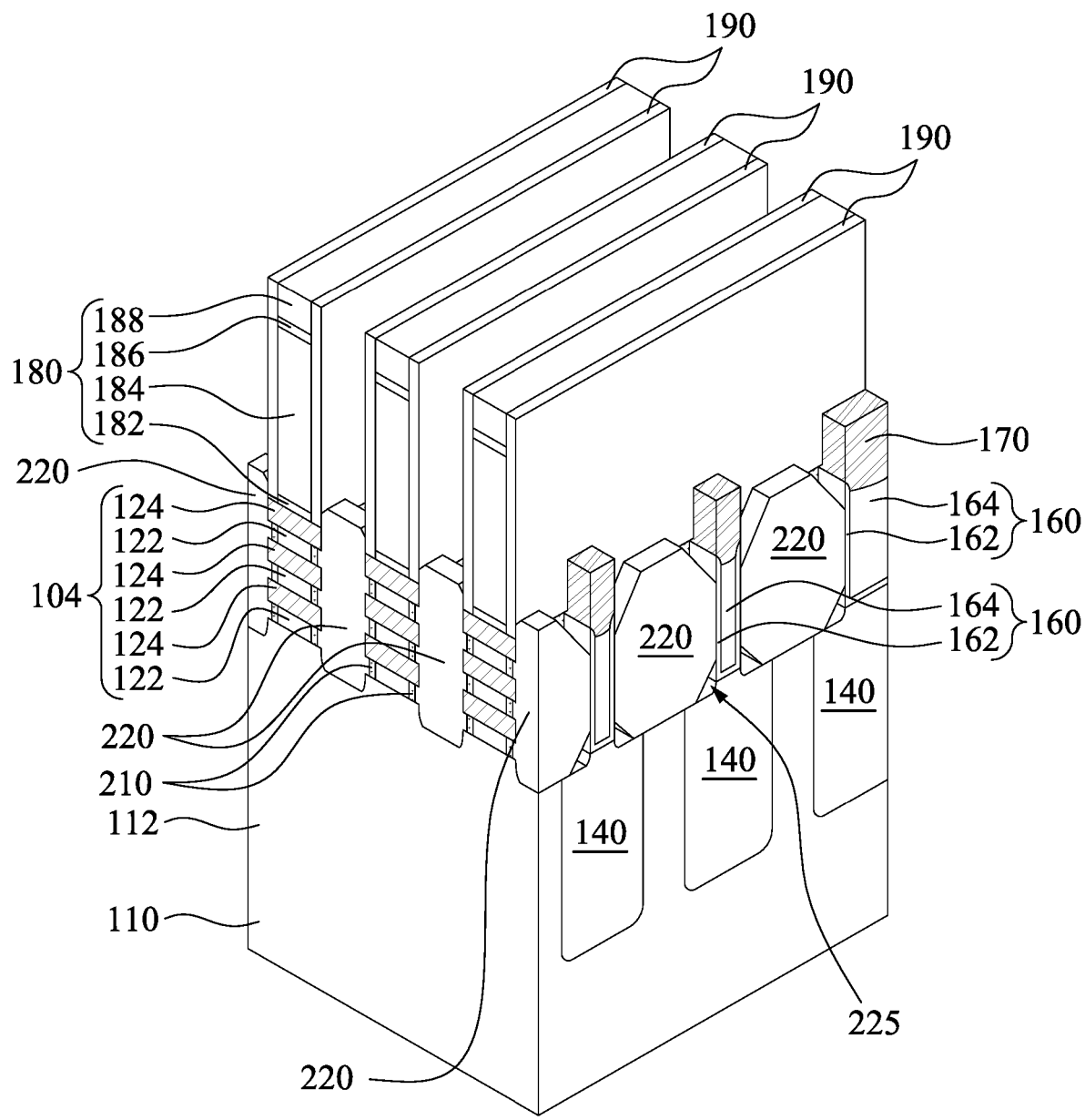

Reference is made to FIG. 12. Source/drain epitaxial structures 220 are formed over the source/drain regions S/D (see FIG. 23B) of the active fin structures 104. The source/drain epitaxial structures 220 may be formed by performing an epitaxial growth process that provides an epitaxial material on the active fin structures 104. During the epitaxial growth process, the dummy gate structures 180, gate spacers 190, and the inner dielectric spacers 210 limit the source/drain epitaxial structures 220 to the source/drain regions S/D. Further, air gaps 225 may be formed under the source/drain epitaxial structures 220. For example, the air gap 225 is defined by the Source/drain epitaxial structures 220, the dummy fin structure 160, and the isolation structure 140. In some embodiments, the lattice constants of the source/drain epitaxial structures 220 are different from the lattice constant of the semiconductor layers 124, so that the semiconductor layers 124 can be strained or stressed by the source/drain epitaxial structures 220 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor layers 124.

In some embodiments, the source/drain epitaxial structures 220 may include Ge, Si, GaAs, AlGaAs, SiGe, GaAsP, SiP, or other suitable material. The source/drain epitaxial structures 220 may be in-situ doped during the epitaxial process by introducing doping species including: p-type dopants, such as boron or $BF_2$; n-type dopants, such as phosphorus or arsenic; and/or other suitable dopants including combinations thereof. If the source/drain epitaxial structures 220 are not in-situ doped, an implantation process (i.e., a junction implant process) is performed to dope the source/drain epitaxial structures 220. In some exemplary embodiments, the source/drain epitaxial structures 220 in an n-type transistor include SiP, while those in a p-type include GeSnB and/or SiGeSnB. In embodiments with different device types, a mask, such as a photoresist, may be formed over n-type device regions, while exposing p-type device regions, and p-type epitaxial structures may be formed on the p-type device regions. The mask may then be removed. Subsequently, a mask, such as a photoresist, may be formed over the p-type device region while exposing the n-type device regions, and n-type epitaxial structures may be formed on the n-type device region. The mask may then be removed.

Once the source/drain epitaxial structures 220 are formed, an annealing process can be performed to activate the p-type dopants or n-type dopants in the source/drain epitaxial structures 220. The annealing process may be, for example, a rapid thermal anneal (RTA), a laser anneal, a millisecond thermal annealing (MSA) process or the like.

Figure 13:
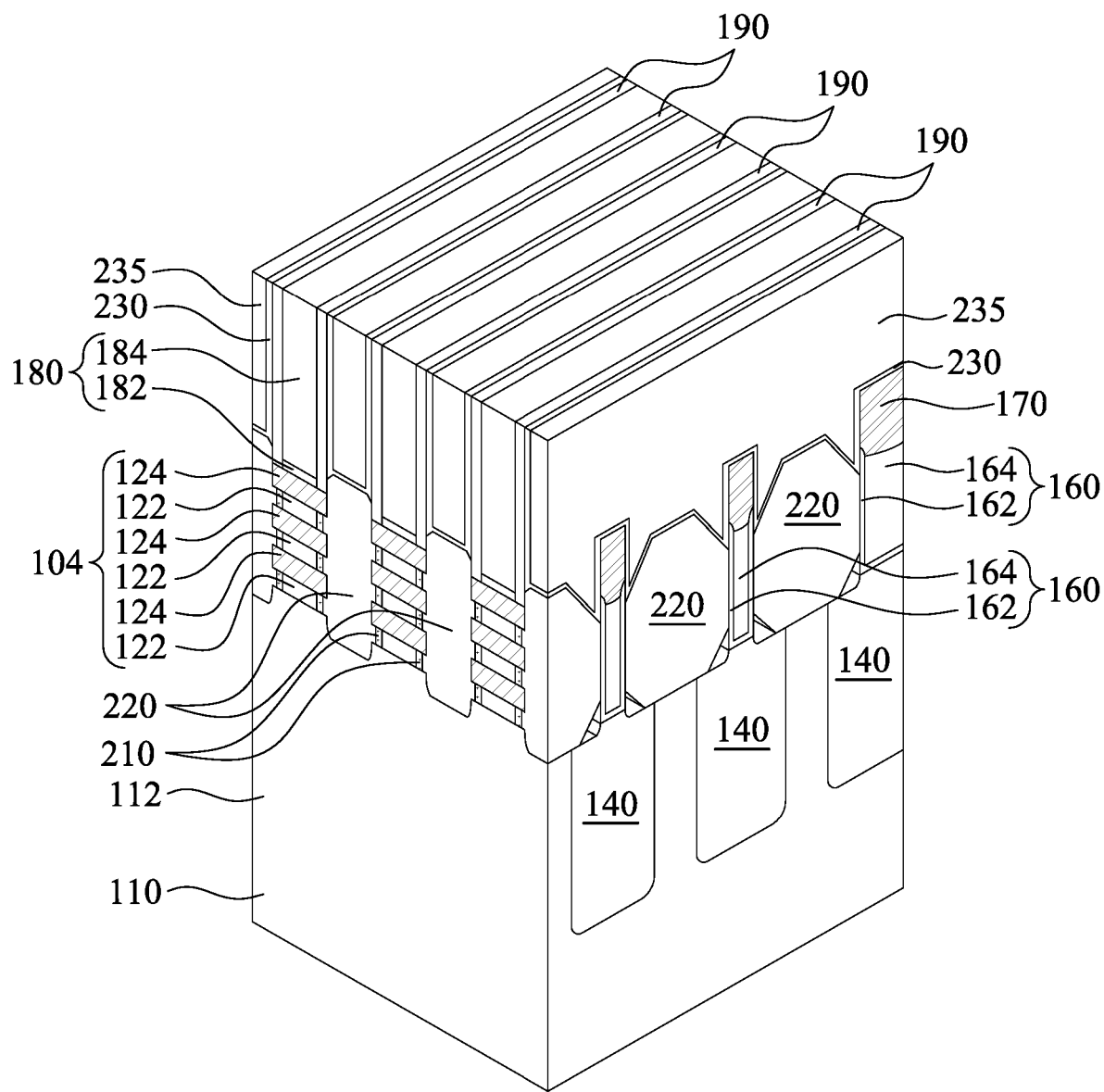

In FIG. 13, an interlayer dielectric (ILD) layer 235 is formed on the substrate 110. In some embodiments, a contact etch stop layer (CESL) 230 is also formed prior to forming the ILD layer 235. In some examples, the CESL 230 includes a silicon nitride layer, silicon oxide layer, a silicon oxynitride layer, and/or other suitable materials having a different etch selectivity than the ILD layer 235. The CESL 230 may be formed by plasma-enhanced chemical vapor deposition (PECVD) process and/or other suitable deposition or oxidation processes. In some embodiments, the ILD layer 235 includes materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL 230. The ILD layer 235 may be deposited by a PECVD process or other suitable deposition technique. In some embodiments, after formation of the ILD layer 235, the wafer may be subject to a high thermal budget process to anneal the ILD layer 235.

In some examples, after depositing the ILD layer 235, a planarization process may be performed to remove excessive materials of the ILD layer 235. For example, a planarization process includes a chemical mechanical planarization (CMP) process which removes portions of the ILD layer 235 (and CESL 230, if present) overlying the dummy gate structures 180 and planarizes a top surface of the semiconductor device 100. In some embodiments, the CMP process also removes hard mask layers 186 and 188 (as shown in FIG. 12) and exposes the dummy gate electrode layer 184.

Figure 14:
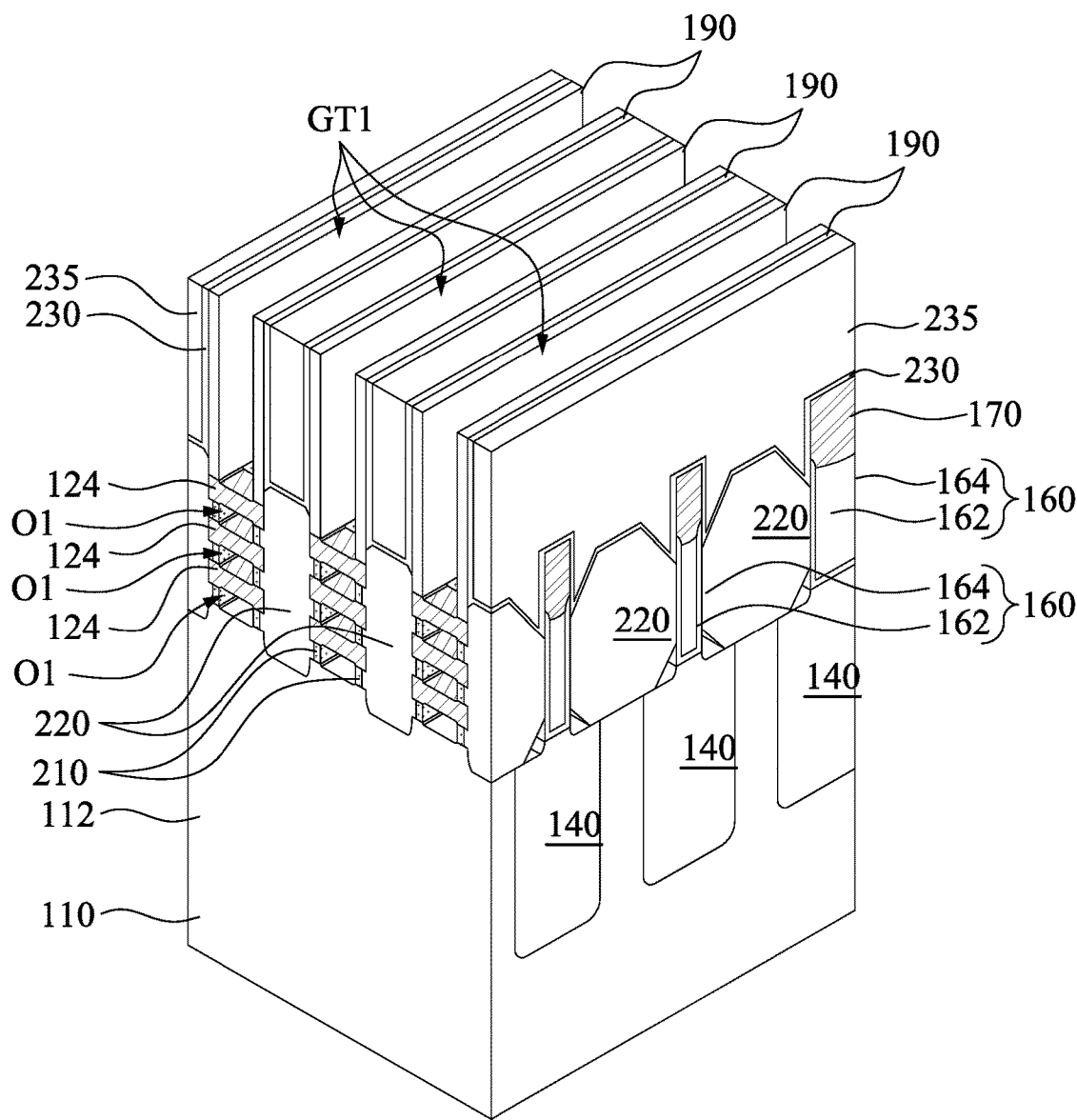

Thereafter, the dummy gate structures 180 are removed first, and then the semiconductor layers (i.e., sacrificial layers) 122 are removed. The resulting structure is illustrated in FIG. 14. In some embodiments, the dummy gate structures 180 are removed by using a selective etching process (e.g., selective dry etching, selective wet etching, or a combination thereof) that etches the materials in dummy gate structures 180 at a faster etch rate than it etches other materials (e.g., gate spacers 190 and/or ILD layer 235), thus resulting in gate trenches GT1 between corresponding gate spacers 190, with the semiconductor layers 122 exposed in the gate trenches GT1. Subsequently, the semiconductor layers 122 in the gate trenches GT1 are removed by using another selective etching process that etches the semiconductor layers 122 at a faster etch rate than it etches the semiconductor layers 124, thus forming openings O1 between neighboring semiconductor layers (i.e., channel layers) 124. In this way, the semiconductor layers 124 become nanosheets suspended over the substrate 110 and between the source/drain epitaxial structures 220. This operation is also called a channel release process. In some embodiments, the semiconductor layers 124 can be interchangeably referred to as nanostructure (nanowires, nanoslabs and nanorings, nanosheet, etc., depending on their geometry). For example, in some other embodiments the semiconductor layers 124 may be trimmed to have a substantial rounded shape (i.e., cylindrical) due to the selective etching process for completely removing the semiconductor layers 122. In that case, the resultant semiconductor layers 124 can be called nanowires. Further, the released portions of the semiconductor layers 124 may be thinner than portions of the semiconductor layers 124 in contact with the source/drain epitaxial structures 220 as shown in FIG. 14.

Figure 15:
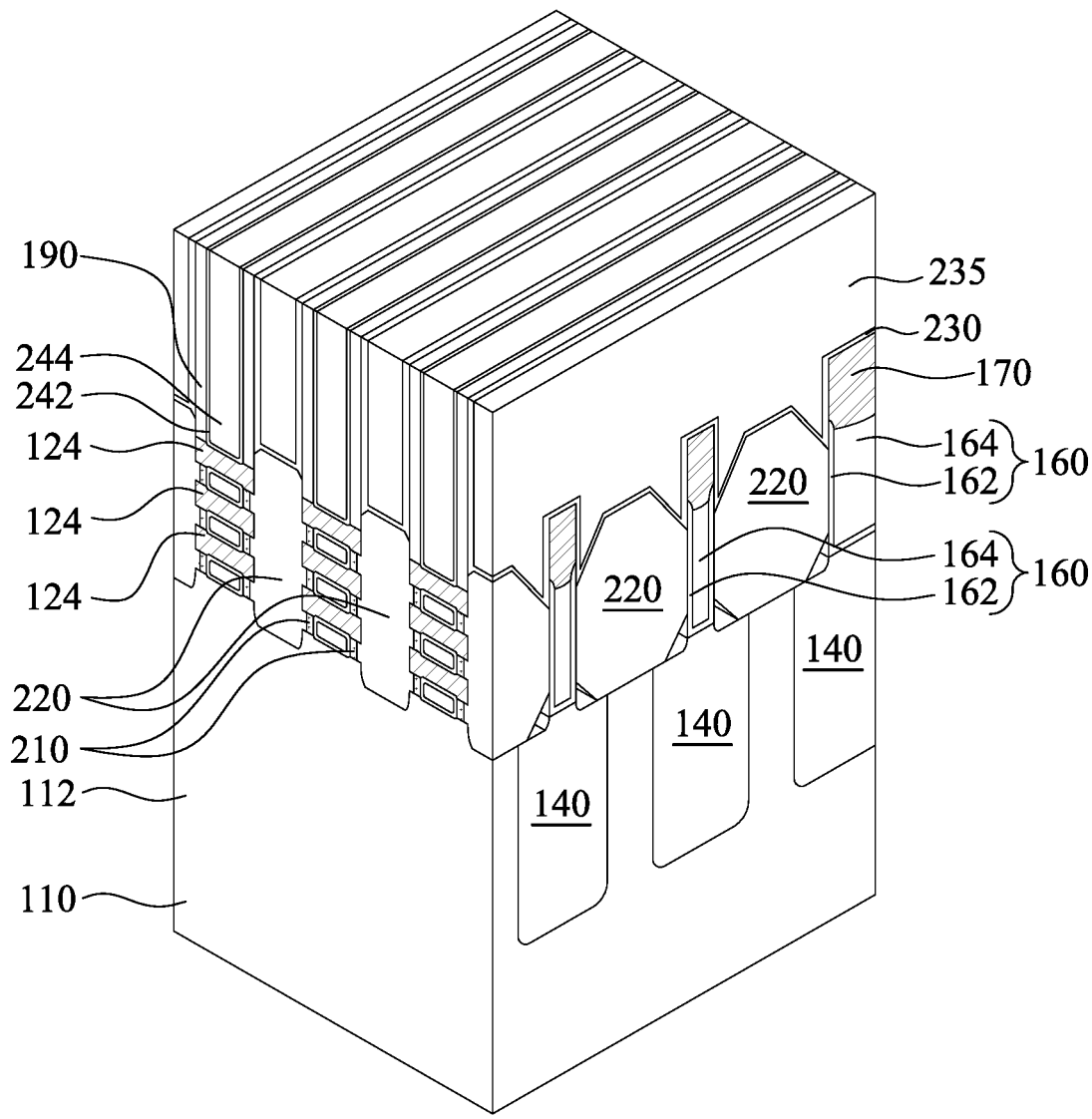

Reference is made to FIG. 15. Thereafter, replacement gate structures 240 (see FIGS. 16A and 16B) are respectively formed in the gate trenches. The gate structures 240 may be the final gates of FinFETs. The final gate structures each may be a high-k/metal gate stack, however other compositions are possible. In some embodiments, each of the gate structures 240 forms the gate associated with the four-sides of the channel region provided by the semiconductor layers 124. Stated another way, each of the gate structures 240 wraps around the semiconductor layers 124 on four sides. In various embodiments, the (high-k/metal) gate structure 240 includes a gate dielectric layer 242 lining the gate trench and a gate electrode over the gate dielectric layer 242. The gate electrode may include a work function metal layer 244 formed over the gate dielectric layer 242. The gate dielectric layer 242 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer 244 used within high-k/metal gate structures 240 may include a metal, metal alloy, or metal silicide. Formation of the gate dielectric layer 242 and the work function metal layer 244 may include multiple deposition processes to form various gate materials, one or more liner layers, and one or more CMP processes to remove excessive gate materials.

In some embodiments, the interfacial layer of the gate dielectric layer 242 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer of the gate dielectric layer 242 may include hafnium oxide ($HfO_2$). Alternatively, the gate dielectric layer 242 may include other high-k dielectrics, such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The work function metal layer 244 may include work function metals to provide a suitable work function for the high-k/metal gate structures 240. For an n-type FinFET, the work function metal layer 244 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type FinFET, the work function metal layer 244 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

Figure 16A:
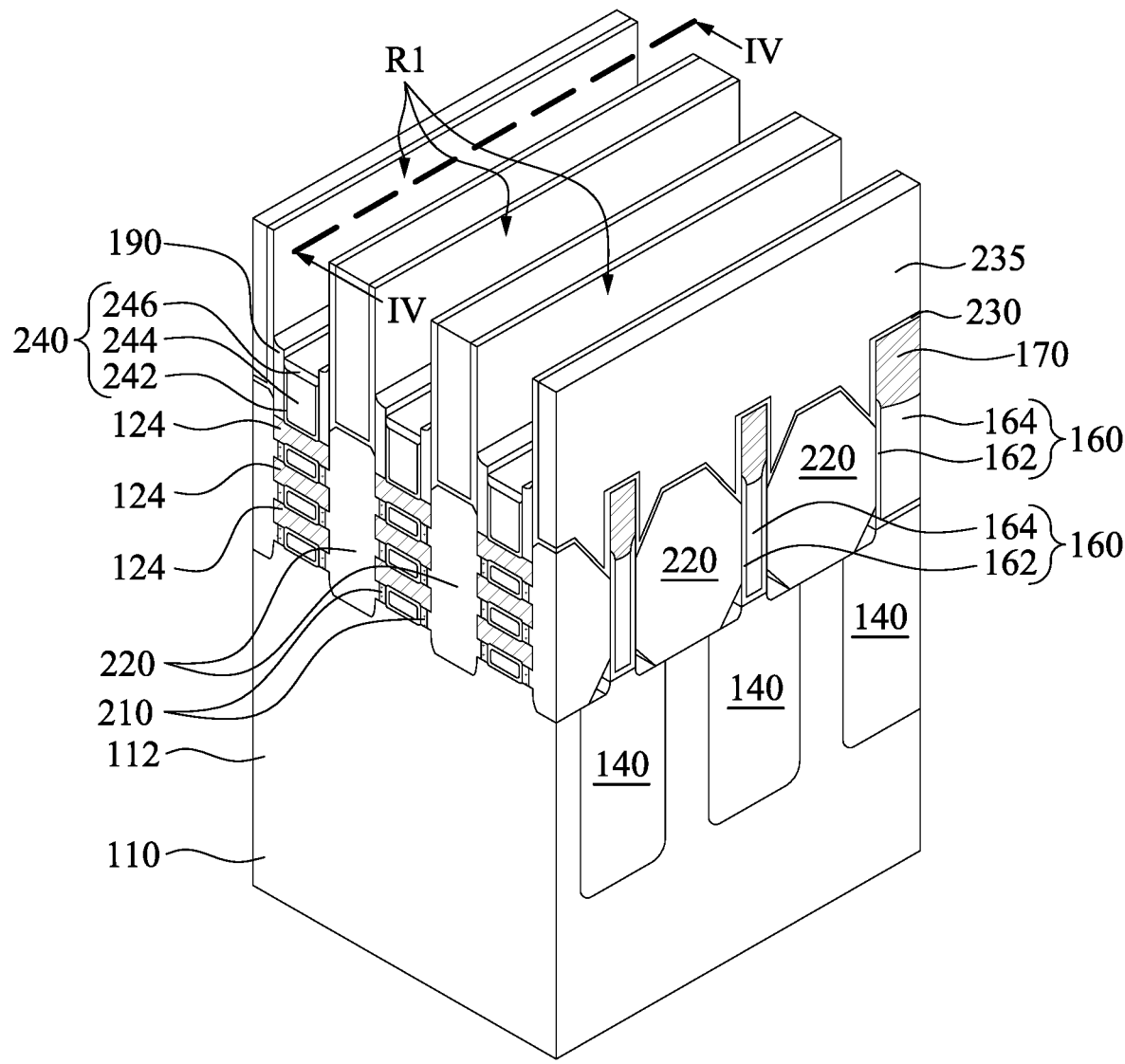
Figure 16B:
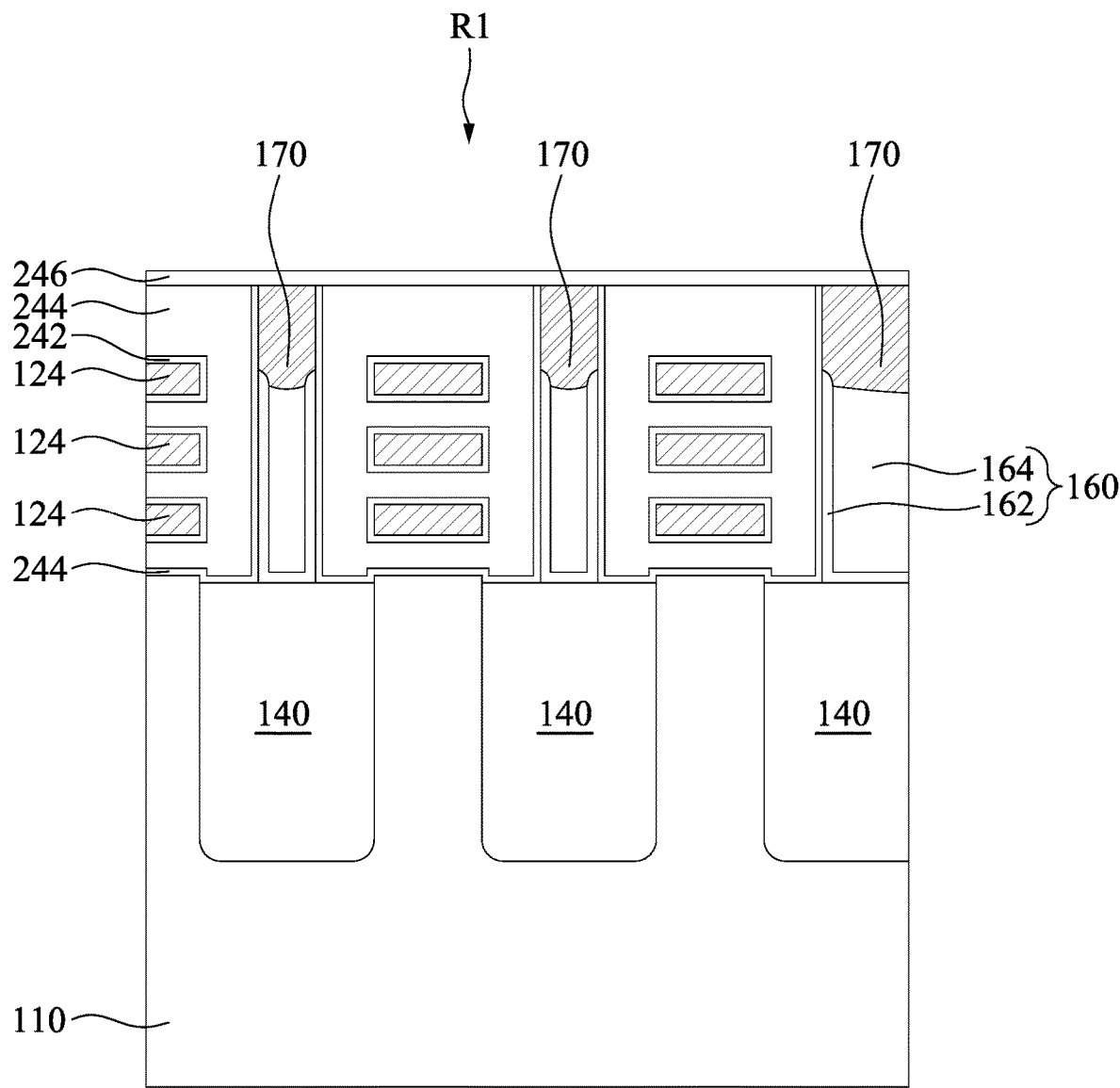

Reference is then made to FIGS. 16A and 16B, where FIG. 16B is a cross-sectional view taken along line IV-IV of FIG. 16A. An etching back process is performed to etch back the gate dielectric layers 242, the work function metal layers 244, and the gate spacers 190, resulting in recesses R1 over the etched-back work function metal layers 244 and the etched-back gate spacers 190. In some embodiments, because the materials of the work function metal layers 244/gate dielectric layers 242 have a different etch selectivity than the gate spacers 190, a first selective etching process may be initially performed to etch back the work function metal layers 244/gate dielectric layers 242 to lower the work function metal layers 244/gate dielectric layers 242. Subsequently, a second selective etching process is performed to lower the gate spacers 190. As a result, the top surfaces of the work function metal layers 244/gate dielectric layers 242 may be at a different level than the top surfaces of the gate spacers 190.

Subsequently, metal caps 246 of the gate structures 240 are formed respectively atop the work function metal layers 244/gate dielectric layers 242 by suitable process, such as CVD or ALD. In some embodiments, the metal caps 246 are formed on the work function metal layers 244/gate dielectric layers 242 using a bottom-up approach. For example, the metal caps 246 are selectively grown on the metal surface, such as the work function metal layer 244, and thus the sidewalls of the gate spacers 190 are substantially free from the growth of the metal caps 246. The metal caps 246 may be, by way of example and not limitation, substantially fluorine-free tungsten (FFW) films having an amount of fluorine contaminants less than 5 atomic percent and an amount of chlorine contaminants greater than 3 atomic percent. The FFW films or the FFW-comprising films may be formed by ALD or CVD using one or more non-fluorine based tungsten precursors such as, but not limited to, tungsten pentachloride ($WCl_5$), tungsten hexachloride ($WCl_6$). In some embodiments, portions of the metal caps 246 may overflow over the gate dielectric layer 242, such that the metal caps 246 may also cover the exposed surface of the gate dielectric layers 242. Since the metal caps 246 are formed in a bottom-up manner, the formation thereof may be simplified by, for example, reducing repeated etching back processes which are used to remove unwanted metal materials resulting from conformal growth.

In some embodiments, the metal caps 246 cover the mask layers 170 over the dummy fin structures 160 as shown in FIG. 16B. Hence, the metal caps 246 interconnect the adjacent work function metal layers 244 which are on opposite sides of the dummy fin structures 160. Stated another way, the adjacent gate structures 240 are electrically connected to each other through the metal caps 246.

Figure 17:
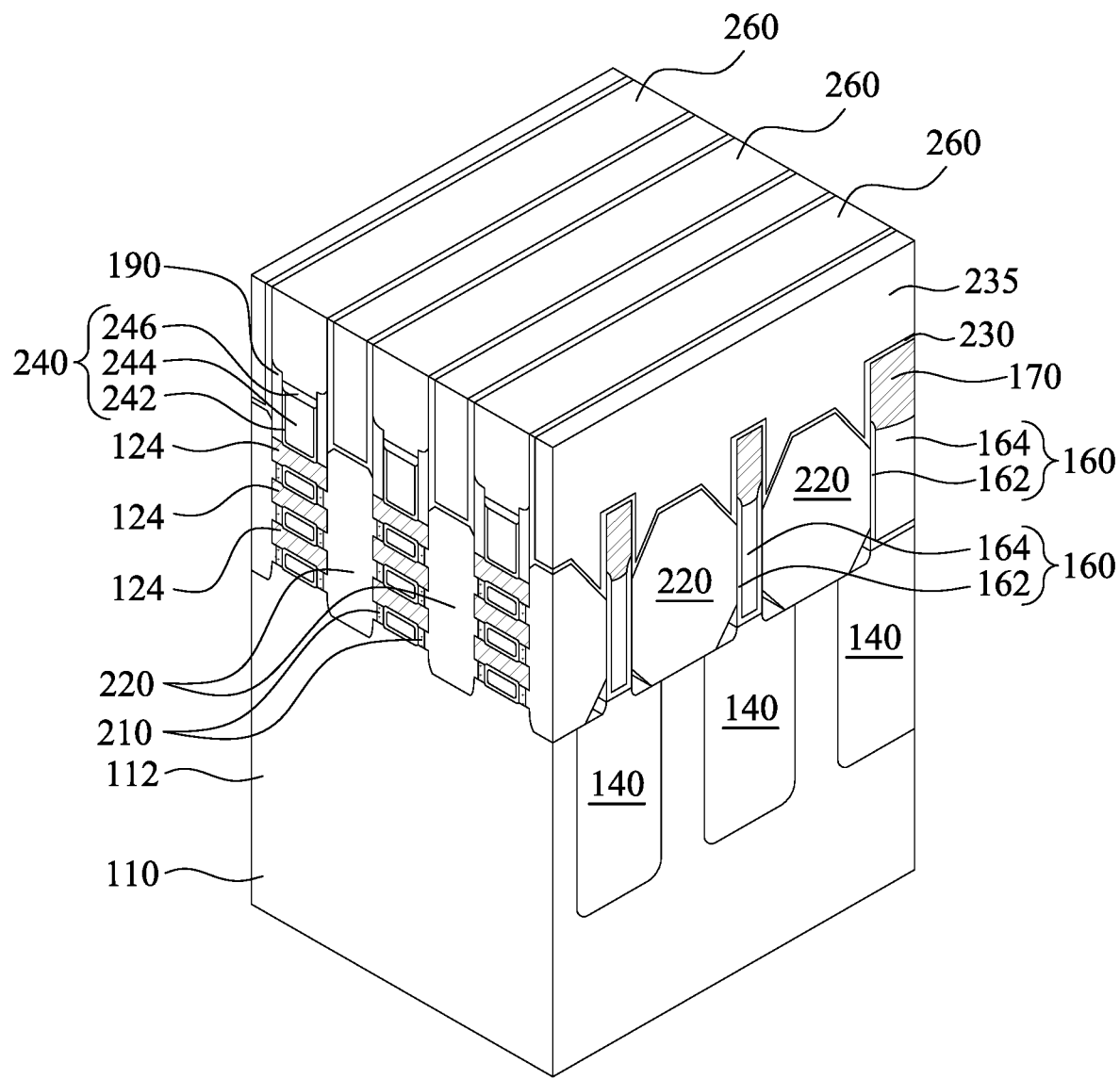

Reference is made to FIG. 17. A dielectric cap layer is deposited over the substrate 110 until the recesses R1 (see FIGS. 16A and 16B) are overfilled. The dielectric cap layer includes SiN, SiC, SiCN, SiON, SiOCN, a combination thereof or the like, and is formed by a suitable deposition technique such as CVD, plasma-enhanced CVD (PECVD), ALD, remote plasma ALD (RPALD), plasma-enhanced ALD (PEALD), a combination thereof or the like. A CMP process is then performed to remove the cap layer outside the recesses R1, leaving portions of the dielectric cap layer in the recesses R1 to serve as dielectric caps 260. During the CMP process, top portions of the ILD layer 235 and the CESL layer 230 are removed as well. Thus, the heights of the ILD layer 235 and the CESL layer 230 are reduced.

Figure 18:
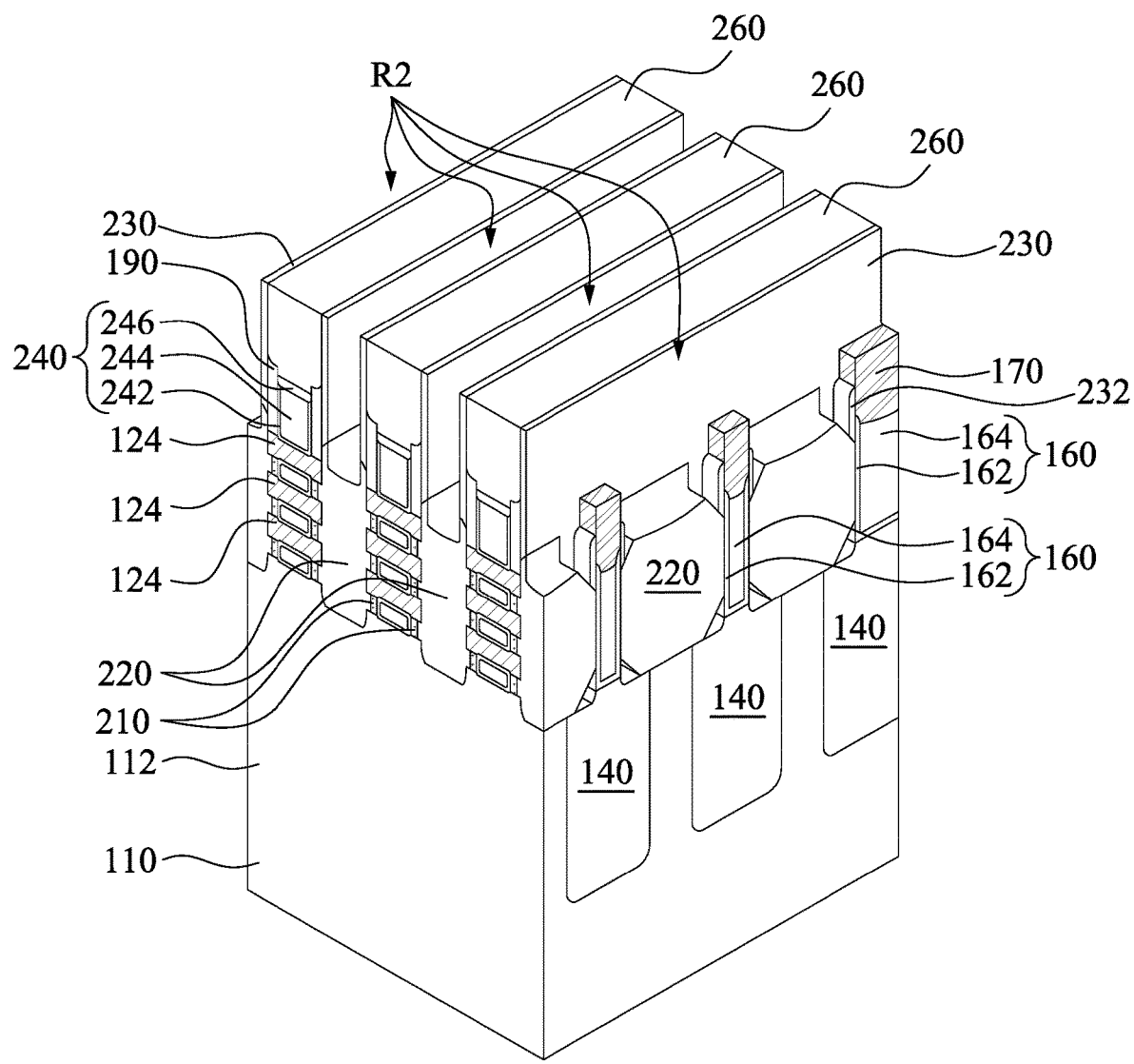

Reference is made to FIG. 18. The ILD layer 235 of FIG. 17 is removed by using, for example, one or more etching processes, to form recesses R2 that expose the CESL 230. In some embodiments, the one or more etching processes are selective etching that etches the ILD layer 235 at a faster etch rate than etching the dielectric caps 260 and the CESL 230. During the removal process of the ILD layer 235, portions of the source/drain epitaxial structures 220 are removed as well as shown in FIG. 18. In some embodiments, the CESL 230 may be trimmed due to the selective etching process for completely removing the ILD layer 235. In this case, portions of the CESL 230 over the mask layers 170 are removed, and CESL residues 232, which are remaining parts of the CESL 230 that are not removed in the operation of etching the spacer layer, exist.

Figure 19:
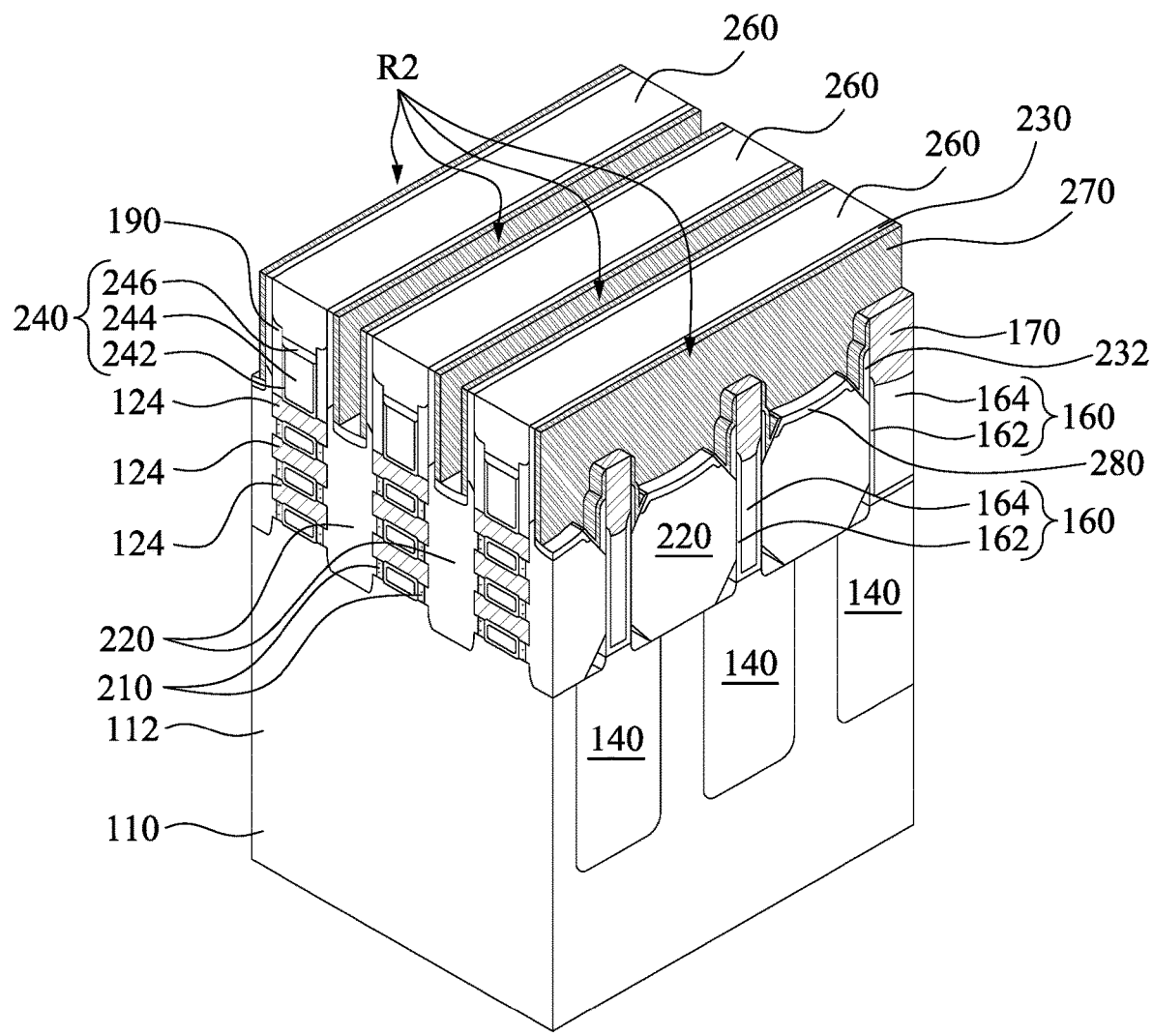

Reference is made to FIG. 19. Contact spacers 270 are formed over the structure of FIG. 18. For example, a dielectric layer is blanket deposited over the structure of FIG. 18, and an anisotropic etching process is performed to remove the horizontal portions of the dielectric layer to form the contact spacers 270. For example, the dielectric layer is anisotropic etched by performing, for example, a reactive ion etch (RIE) process or other suitable processes. Anisotropic etching means different etch rates in different directions in the material. That is, an anisotropic etching removes the material being etched at different rates in different directions. For example, in FIG. 19, the anisotropic etching removes the horizontal portions of the dielectric layer faster than the vertical portions thereof. As such, the contact spacers 270 expose the source/drain epitaxial structures 220 and top surfaces of the mask layers 170 while covering the sidewalls of the mask layers 170 and the CESL residues 232.

Subsequently, metal alloy layers 280 are respectively formed above the source/drain epitaxial structures 220. The metal alloy layers 280, which may be silicide layers, are respectively formed over the exposed source/drain epitaxial structures 220 by a self-aligned silicide (salicide) process. The silicide process converts the surface portions of the source/drain epitaxial structures 220 into the silicide contacts. Silicide processing involves deposition of a metal that undergoes a silicidation reaction with silicon (Si). In order to form silicide contacts on the source/drain epitaxial structures 220, a metal material is blanket deposited on the source/drain epitaxial structures 220. After heating the wafer to a temperature at which the metal reacts with the silicon of the source/drain epitaxial structures 220 to form the metal alloy layers 280, unreacted metal is removed. The silicide layers remain over the source/drain epitaxial structures 220, while unreacted metal is removed from other areas. The silicide layer may include a material selected from titanium silicide, cobalt silicide, nickel silicide, platinum silicide, nickel platinum silicide, erbium silicide, palladium silicide, combinations thereof, or other suitable materials. In some embodiments, the metal alloy layer 280 may include germanium.

Figure 20:
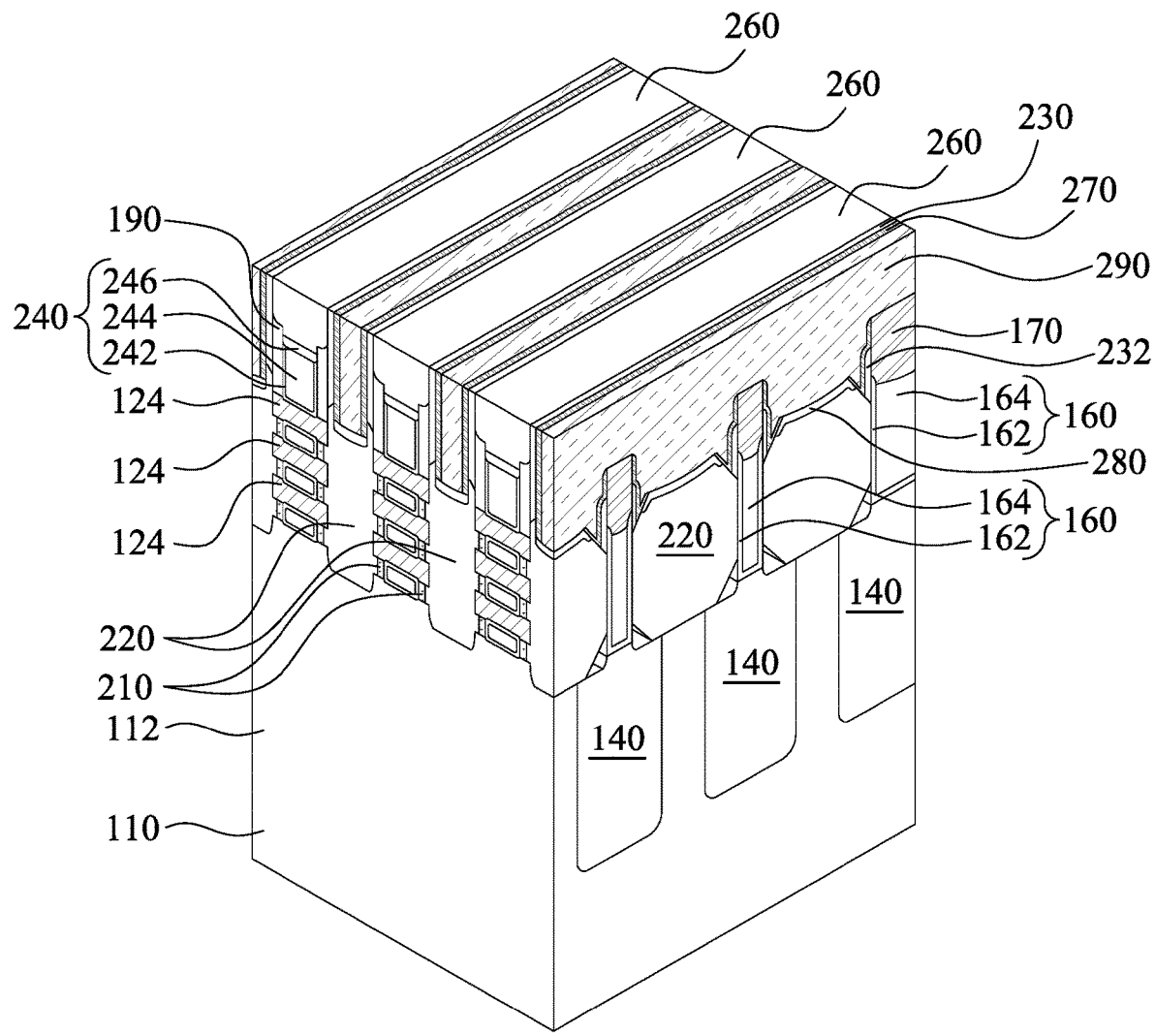

Reference is made to FIG. 20. Conductive layers 290 are filled in the recesses R2 (see FIG. 19). Formation of the conductive layers 290 includes depositing one or more metal materials overfilling the recesses R2, and then performing a CMP process to remove excessive metal materials outside the recesses R2. In some embodiments, the conductive layers 290 are made of metal, such as W, Co, Ru, Mo, Al, Cu, or other suitable materials. Further, barrier layers may be formed in the recesses R2 before the formation of the conductive layers 290. The barrier layers may be made of TiN, TaN, or combinations thereof.

Figure 21:
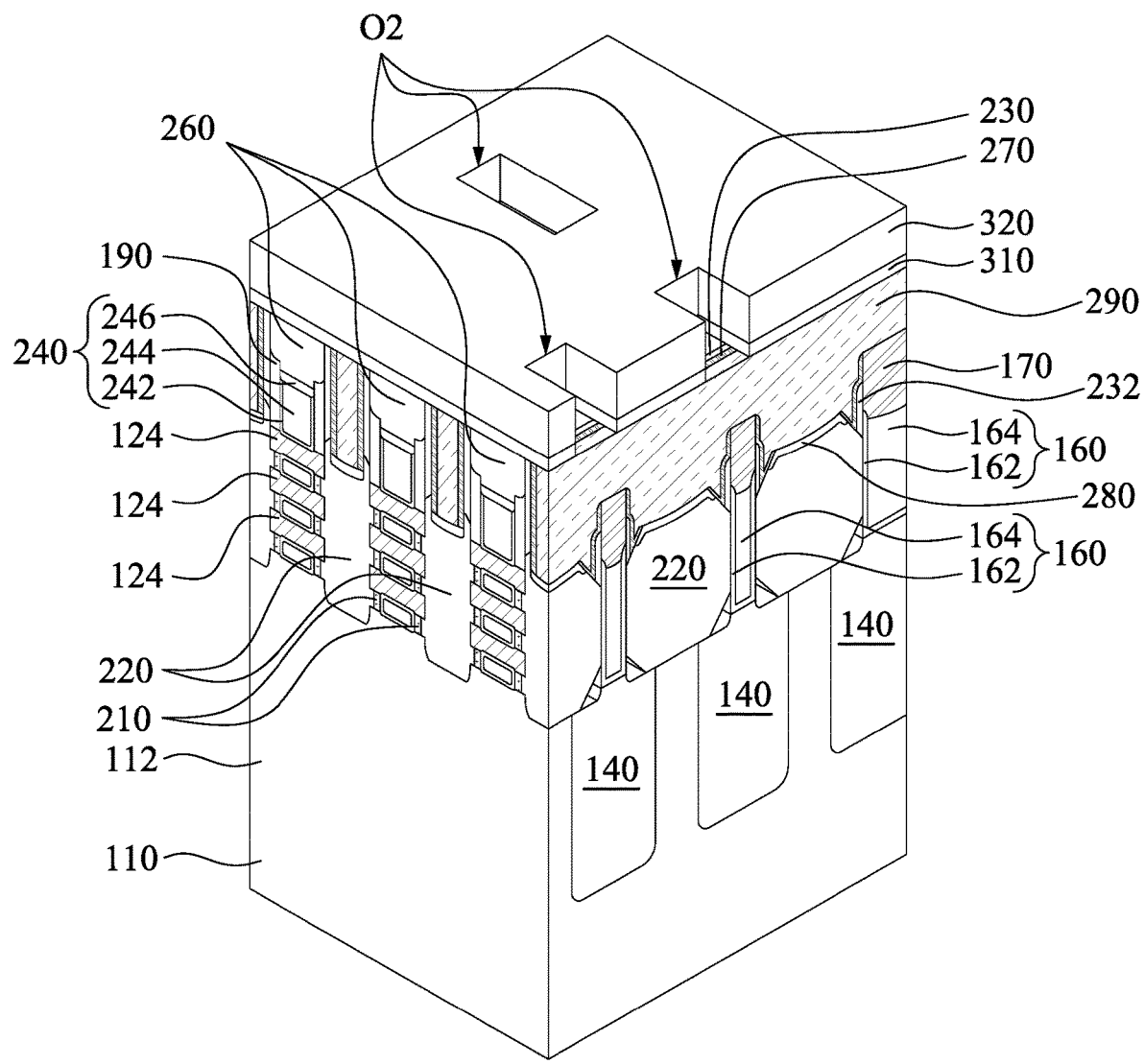

Reference is made to FIG. 21. A first hard mask layer 310 and a second hard mask layer 320 are subsequently formed over the structure of FIG. 20. Each of the first hard mask layer 310 and the second hard mask layer 320 may be formed from a material including an oxide material, such as titanium oxide, silicon oxide, or the like; a nitride material, such as silicon nitride, boron nitride, titanium nitride, tantalum nitride; a carbide material, such as tungsten carbide, silicon carbide; a semiconductor material such as silicon; a metal, such as titanium, tantalum; or combinations thereof. The second hard mask layer 320 may include more than one layer and include more than one material, and may include a material different from the first hard mask layer 310. In some embodiments, when the first hard mask layer 310 includes tungsten, titanium nitride, silicon, titanium oxide, or a metal oxide, the second hard mask layer 320 may be formed from silicon nitride, or an oxide material. The first hard mask layer 310 and the second hard mask layer 320 may be formed using a process such as CVD, ALD, or the like.

Subsequently, a plurality of openings O2 are formed in the first hard mask layer 310 and the second hard mask layer 320, and at least portions of the conductive layers 290 are exposed by the openings O2. In some embodiments, the openings O2 further expose portions of dielectric materials (e.g., the CESL 230, the dielectric caps 260, and the contact spacers 270) adjacent the conductive layers 290. Further, the openings O2 are formed directly over the mask layers 170.

Figure 22A:
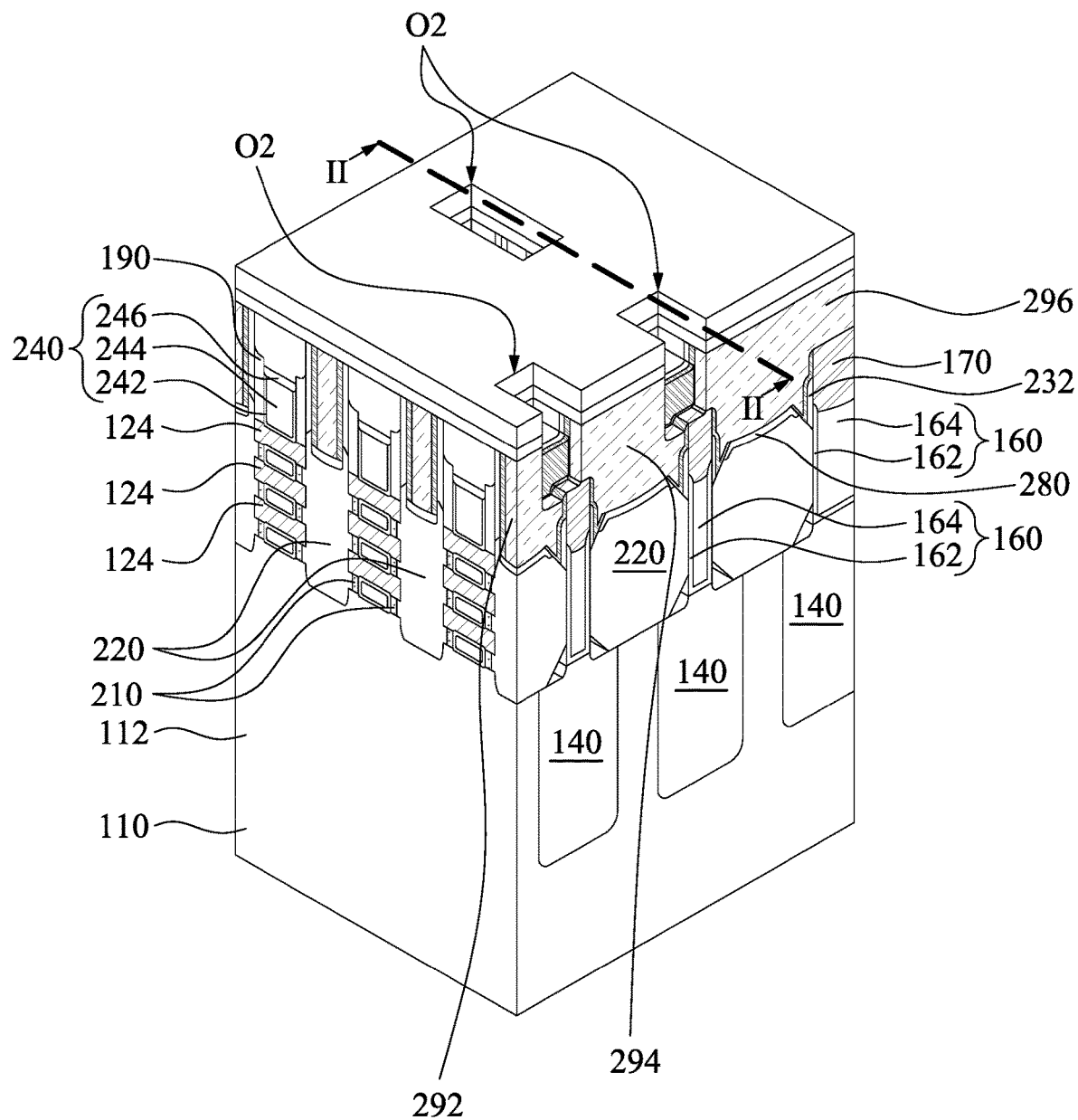
Figure 22B:
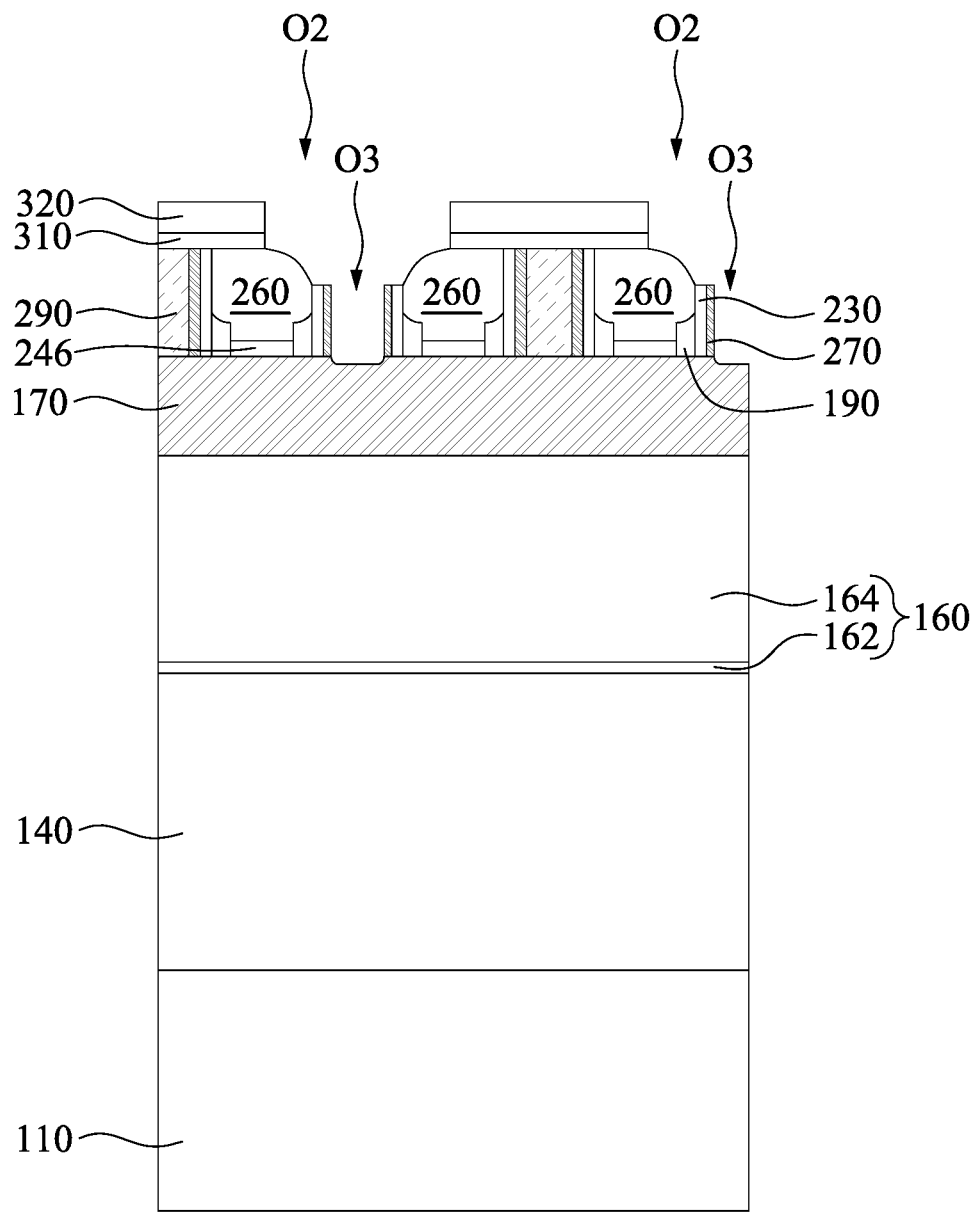

Reference is made to FIGS. 22A and 22B, where FIG. 22B is a cross-sectional view taken along line II-II of FIG. 22A. The conductive layers 290 are etched by using the first hard mask layer 310 and the second hard mask layer 320 as etch masks, such that openings O3 are formed in the conductive layers 290. That is, the openings O2 extend into the conductive layers 290 and cut some of the conductive layers 290 into individual pieces (e.g., source/drain contacts 292, 294, and 296). The conductive layers 290 are patterned using a selective etching process (e.g., selective dry etching, selective wet etching, or a combination thereof) that etches materials in the conductive layers 290 at a faster etch rate than it etches dielectric materials (e.g., the CESL 230, the dielectric caps 260, the contact spacers 270, and the mask layers 170).

In some embodiments, the conductive layers 290 may be over-etched in order to completely separate the source/drain contacts 292, 294, and 296. As such, portions of the dielectric materials (e.g., the CESL 230, the dielectric caps 260, the contact spacers 270, and the mask layers 170) are removed. For example, as shown in FIG. 22B, top portions of the dielectric caps 260 exposed by the openings O2 are etched, the heights of portions of the CESL 230 exposed by the openings O2 are reduced, the heights and thicknesses of portions of the contact spacers 270 exposed by the openings O2 are reduced, and/or the mask layers 170 are recessed. Further, a thickness of the second hard mask layer 320 is reduced, as shown in FIG. 22A. Eventually, the openings O3 expose the mask layers 170. That is, the openings O3 are formed over the mask layers 170. With this configuration, the openings O3 have low aspect ratio which is benefit for the over-etching process.

Figure 23A:
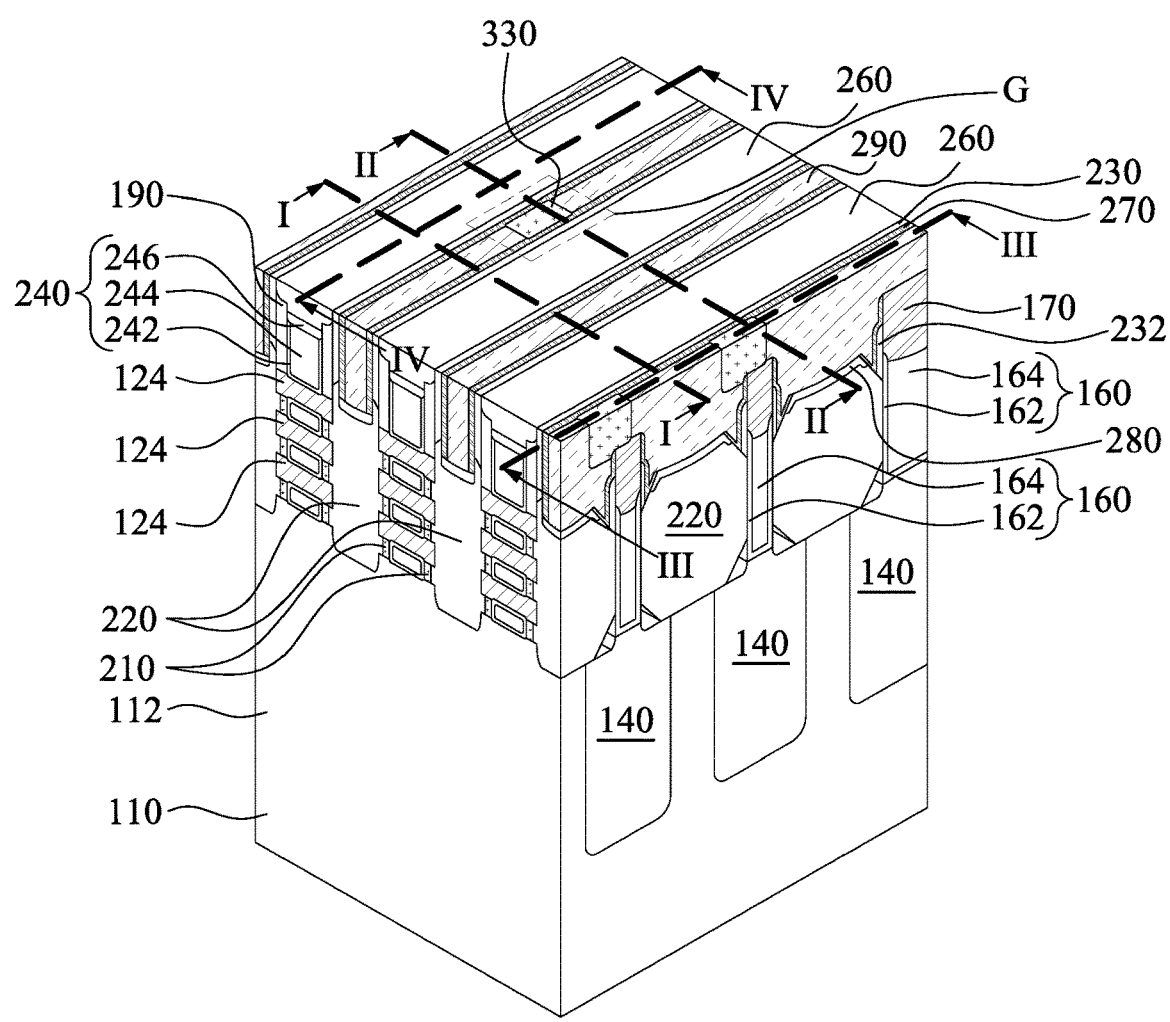
FIG. 23F is an enlarged view of area F in FIG. 23D.
FIG. 23G is an enlarged view of area G in FIG. 23A.
FIG. 23H is an enlarged view of area H in FIG. 23B.
FIG. 23I is an enlarged view of area I in FIG. 23C.
Figure 23B:
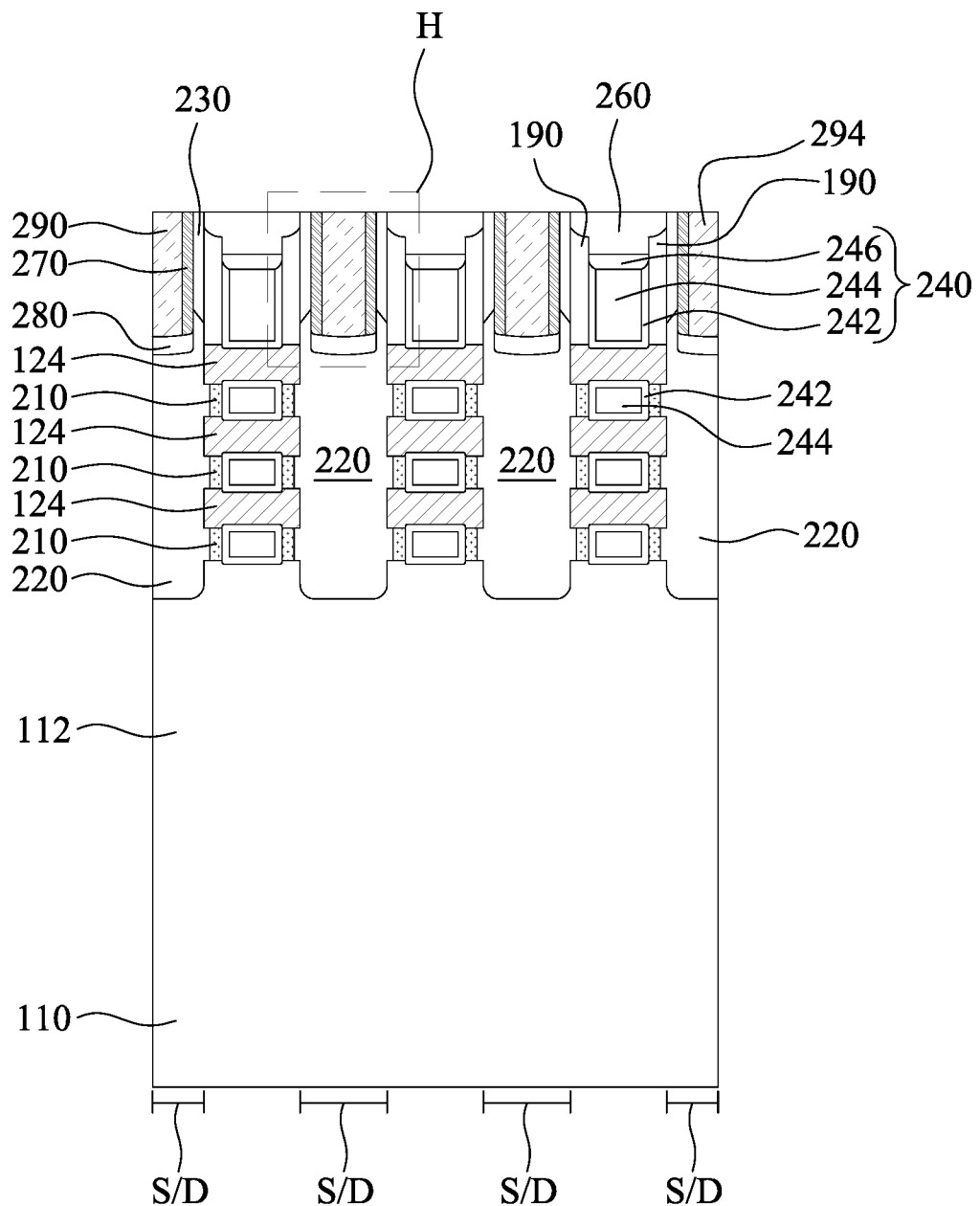
Figure 23C:
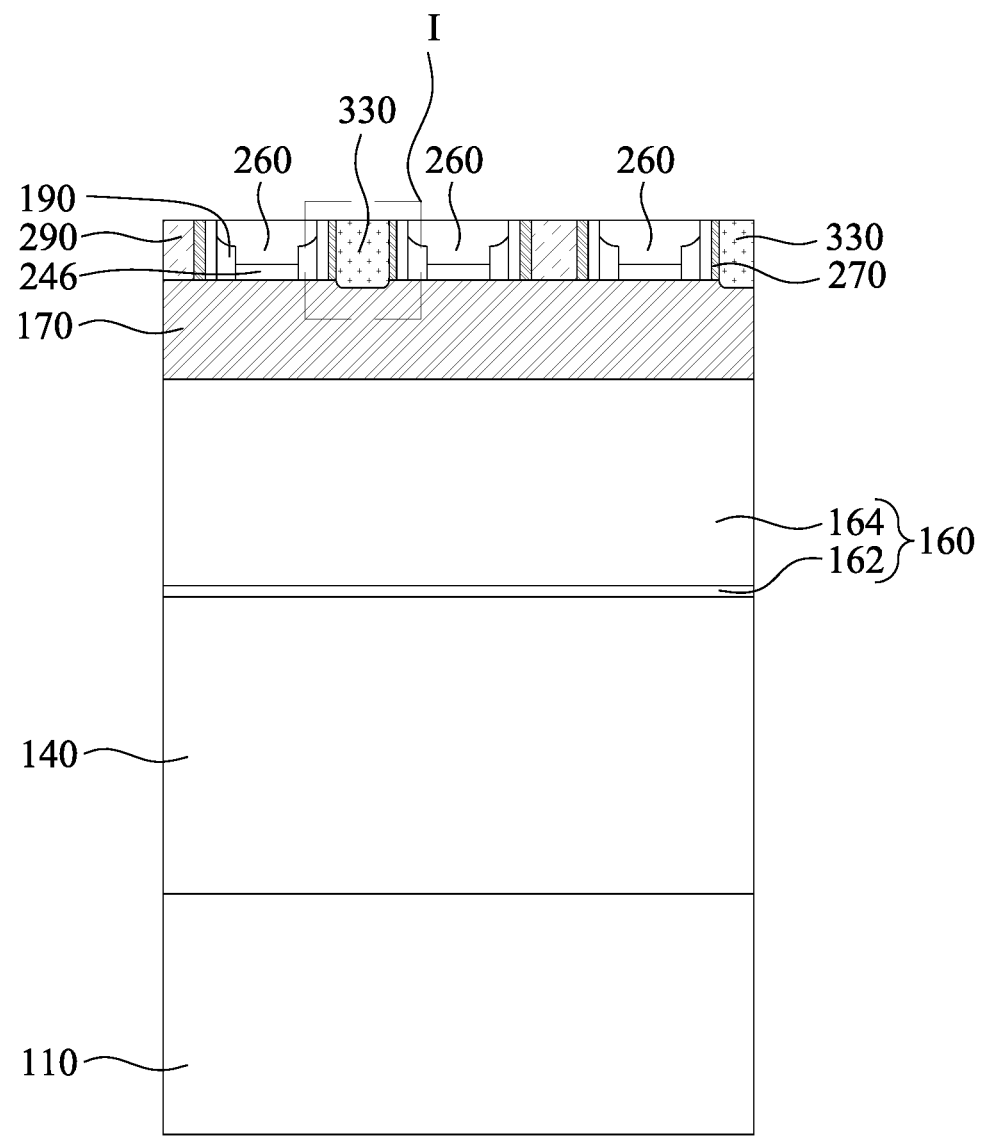
Figure 23D:
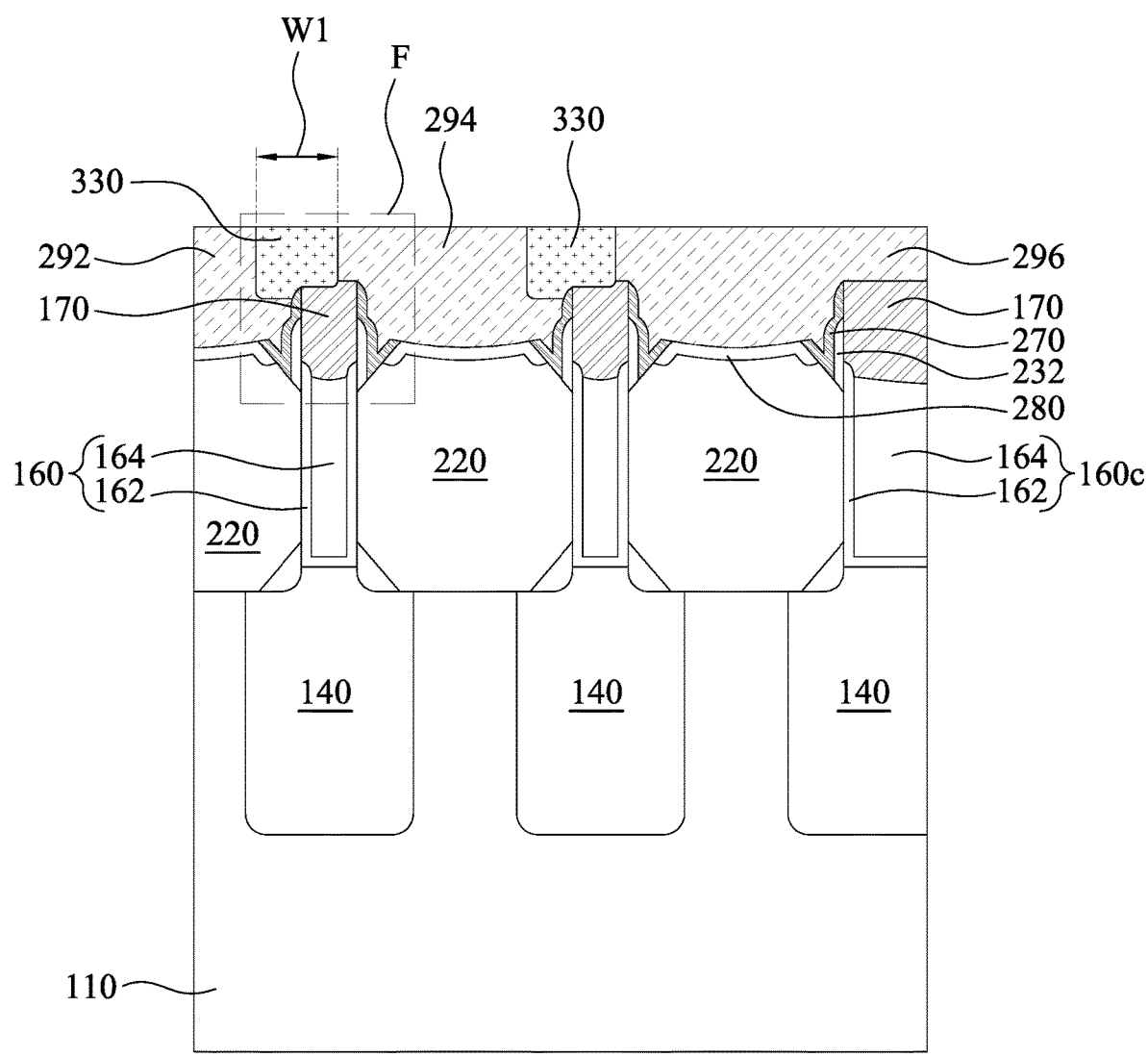
Figure 23E:
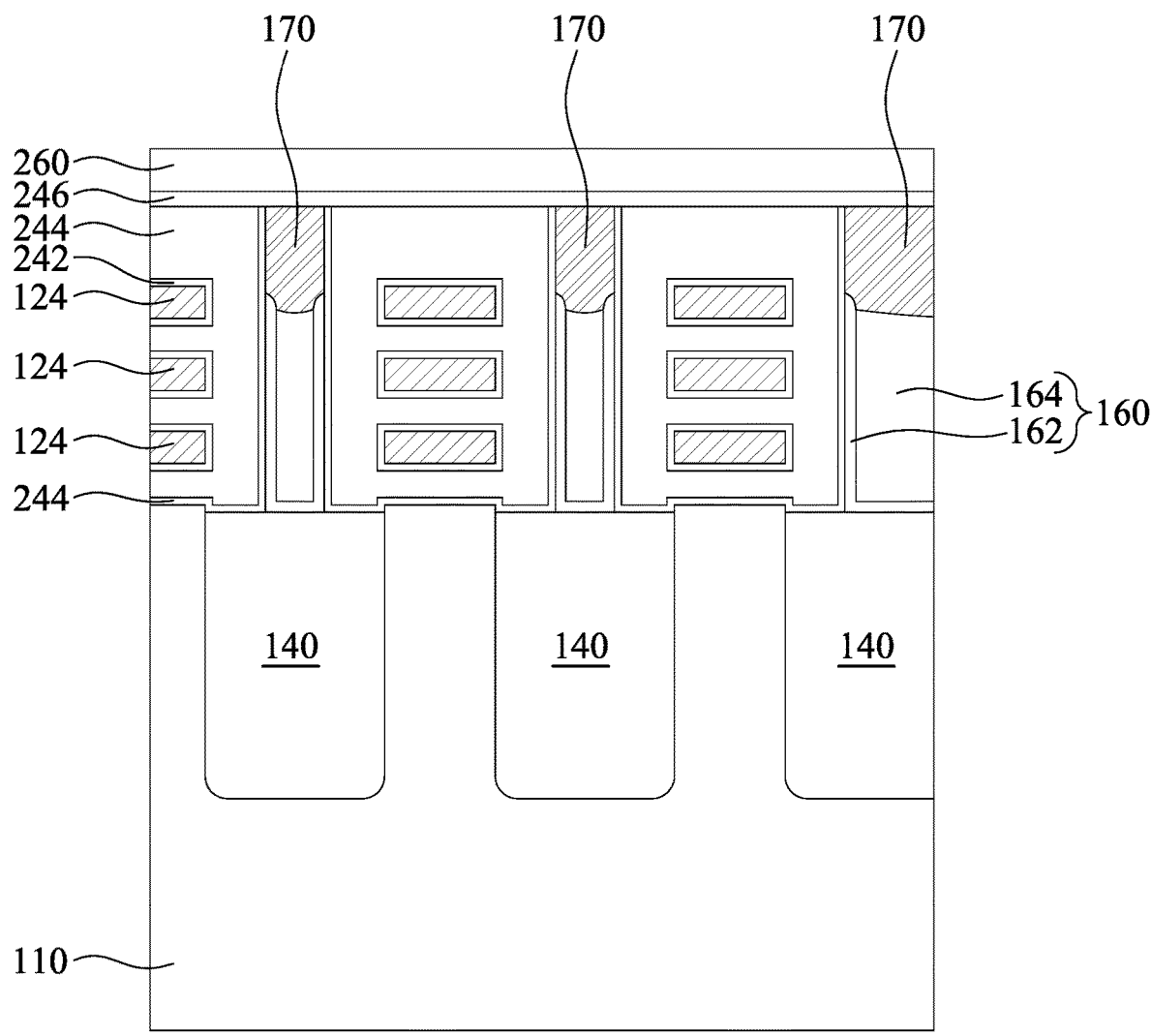

Reference is made to FIGS. 23A and 23E, where FIG. 23B is a cross-sectional view taken along line I-I of FIG. 23A, FIG. 23C is a cross-sectional view taken along line II-II of FIG. 23A, FIG. 23D is a cross-sectional view taken along line III-III of FIG. 23A, and FIG. 23E is a cross-sectional view taken along line IV-IV of FIG. 23A. The first hard mask layer 310 and the second hard mask layer 320 are removed and dielectric materials are filled in the openings O3 (see FIG. 22B), and a CMP process is then performed to remove the dielectric materials outside the openings O3, leaving portions of the dielectric materials in the openings O3 to serve as isolation plugs 330. In some embodiments, during the CMP process, top portions of the CESL 230, the dielectric caps 260, the contact spacers 270, the conductive layers 290 (the source/drain contacts 292, 294, 296), and the isolation plugs 330 are removed as well. Thus, the heights of the CESL 230, the dielectric caps 260, the contact spacers 270, the conductive layers 290 (292, 294, 296), and the isolation plugs 330 are lowered. In some embodiments, the isolation plugs 330 include low-k materials such as SiOCN, tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials.

The semiconductor device 100 includes a plurality of transistors. Each of the transistors includes the semiconductor layers (channel layers) 124, the gate structure 240 crossing (or covering) the semiconductor layers 124, and the source/drain epitaxial structures 220 on opposite sides of the semiconductor layers 124. The semiconductor device 100 further includes the dummy fin structures 160 between adjacent transistors. The dummy fin structures 160 separate the source/drain epitaxial structures 220 of the adjacent transistors from each other. Further, the dummy fin structures 160 are in contact with the source/drain epitaxial structures 220. The mask layers 170 are formed over the dummy fin structures 160. The source/drain contacts (e.g., the source/drain contacts 292, 294, and 296 and the conductive layers 290) are formed over and electrically connected to the source/drain epitaxial structures 220. The isolation plugs 330 are formed over the mask layers 170 to separate the adjacent source/drain contacts 292, 294, and 296 from each other. That is, the isolation plugs 330 are in contact with the source/drain contacts 292, 294, and 296.

Figure 23F:
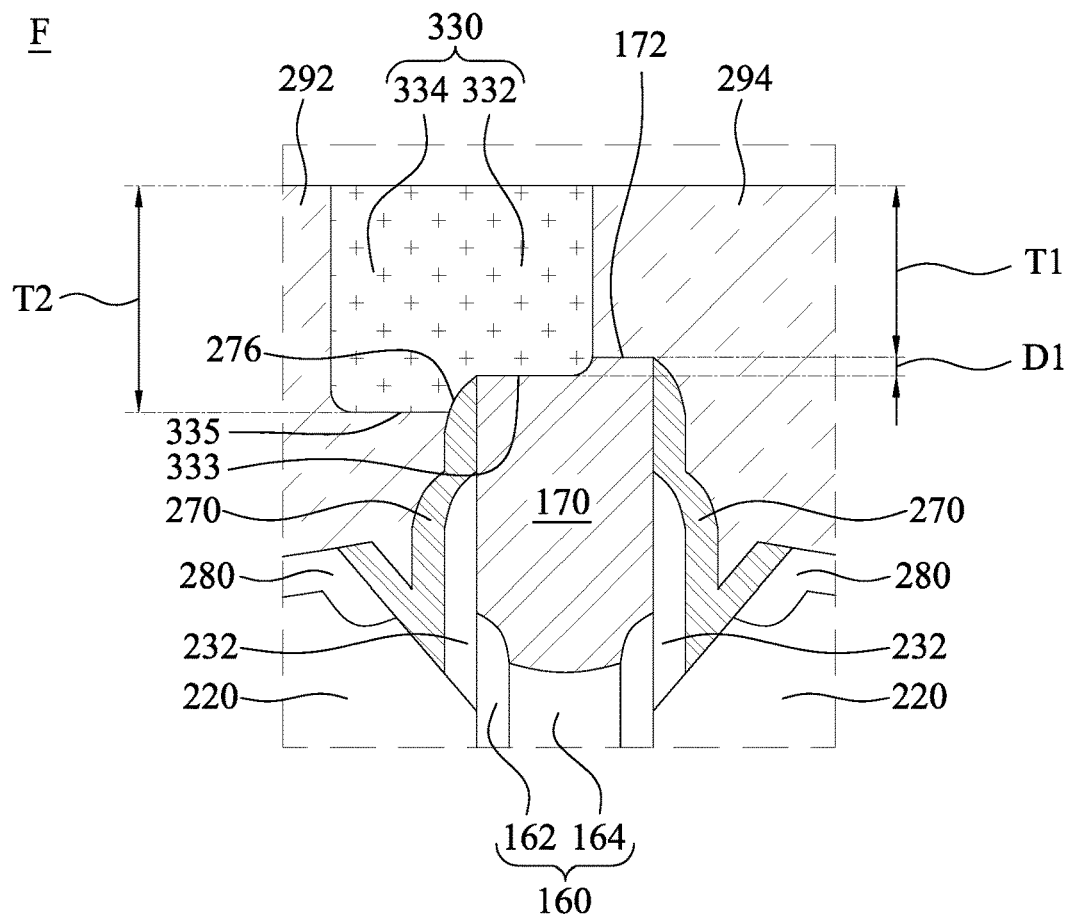

Reference is made to FIGS. 23D and 23F, where FIG. 23F is an enlarged view of area F in FIG. 23D. The isolation plug 330 includes a first portion 332 (directly) on the mask layer 170 and a second portion 334 (directly) on the source/drain contact 292 (or 294). The first portion 332 is in contact with the mask layer 170, and the second portion 334 is separated from the mask layer 170 by the contact spacer 270 that extends along the sidewall of the mask layer 170. In some embodiments, the second portion 334 is directly over the metal alloy layer 280. The first portion 332 and the second portion 334 have different thicknesses. For example, in FIG. 23F, the second portion 334 has a thickness T2 greater than a thickness T1 of the first portion 332. In some embodiments, the thickness T1 (and T2) is in a range of about 15 nm and about 40 nm. Further, the isolation plug 330 has a width W1 (in the Y direction) in a range of about 8 nm and about 50 nm. The width W1 of the isolation plug 330 may depend on the desired size of the source/drain contacts 292, 294, and 296. In some embodiments, the isolation plug 330 partially lands on the mask layer 170 as shown in FIG. 23D. However, the isolation plug 330 may fully cover the mask layer 170 in the cross-sectional view.

As mentioned above, portions of the mask layer 170 may be etched during the etching process shown in FIG. 22A. As such, a bottom surface 333 of the first portion 332 of the isolation plug 330 is lower than the topmost surface 172 of the mask layer 170. Further, a portion of the first portion 332 embedded in the mask layer 170 has a depth D1 greater than 0 nm and equal to or less than about 20 nm. Also, a portion of the contact spacer 270 covered by the isolation plug 330 has a height lower than a height of another portion of the contact spacer 270 uncovered by the isolation plug 330 due to the etching process. That is, the portion of the contact spacer 270 covered by the isolation plug 330 has a top surface 276 lower than the topmost surface 172 of the mask layer 170.

In FIGS. 23D and 23F, the isolation plugs 330 separate the source/drain contacts 292, 294, and 296 from each other. As such, the source/drain contacts 292, 294, and 296 are electrically isolated from each other. A portion of the source/drain contact 292 (294) is directly under (the second portion 334 of) the isolation plug 330. The source/drain contact 292 (294) is in contact with the bottom surface 335 of the second portion 334 of the isolation plug 330. An interface 335 between the portion of the source/drain contact 292 and the second portion 334 of the isolation plug 330 (or the bottom surface of the second portion 334 of the isolation plug 330 or the top surface of the portion of the source/drain contact 292) is below the topmost surface 172 of the mask layer 170. Since there is still a portion of the source/drain contact 292 (294) remaining under the isolation plug 330, the source/drain contact 292 can provide good conductivity with the wide isolation plug 330.

As shown in FIGS. 23D and 23F, the source/drain contacts 292, 294, and 296 are separated from the mask layers 170 by the contact spacers 270. Also, the source/drain contacts 294 and 296 are in contact with the topmost surface 172 of the mask layer 170. In some embodiments, the source/drain contact 296 covers the dummy fin structure 160c. As such, there is more area for conductive vias to land on the source/drain contact 296. For example, the conductive via may be land on a portion of the source/drain contact 296 directly over the dummy fin structure 160c, thereby increasing routing flexibility of the interconnection structure formed thereon.

Figure 23G:
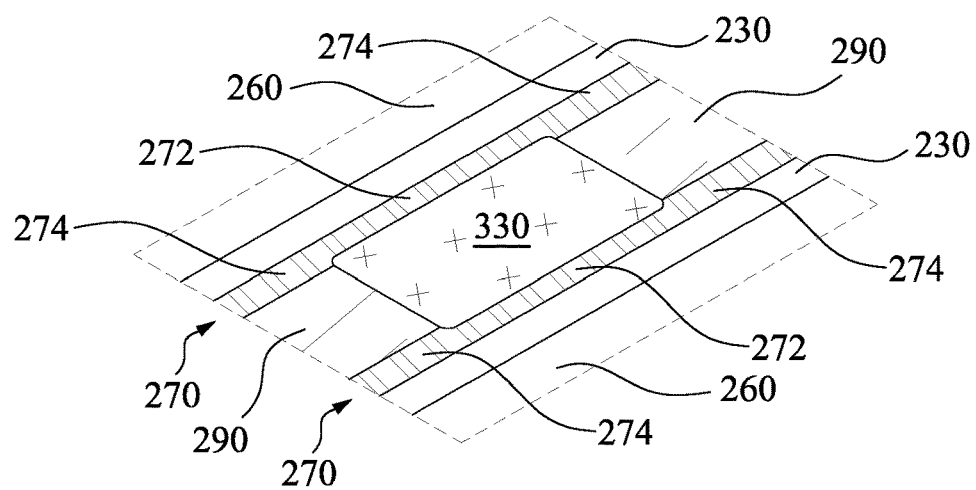
Figure 23H:
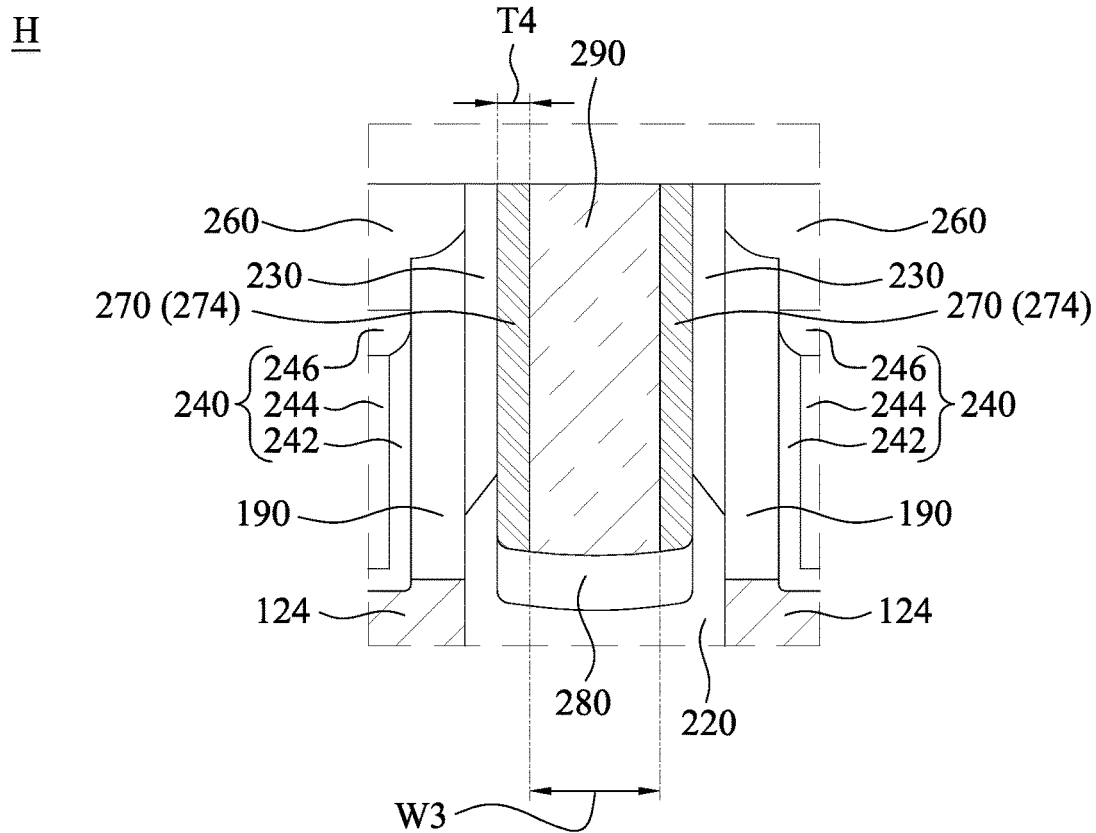
Figure 23I:
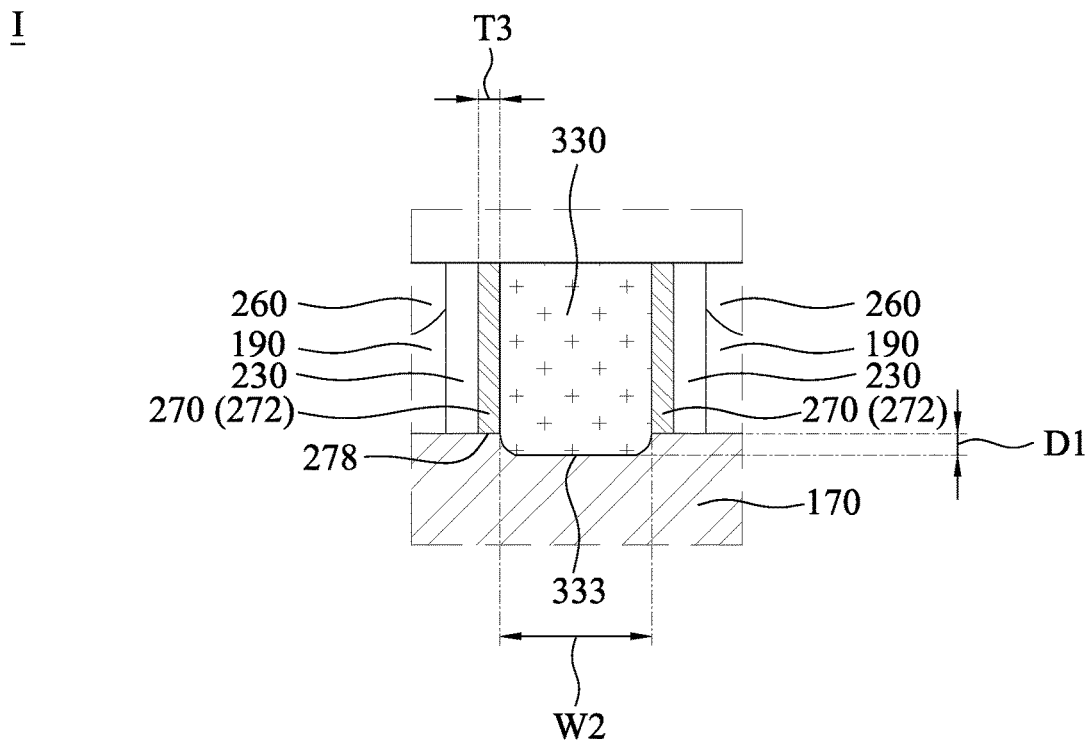

Reference is made to FIG. 23G-23I, where FIG. 23G is an enlarged view of area G in FIG. 23A, FIG. 23H is an enlarged view of area H in FIG. 23B, and FIG. 23I is an enlarged view of area I in FIG. 23C. As mentioned above, during the etching process of FIG. 22A, portions of the contact spacers 270 exposed by the second hard mask layer 320 are also trimmed and may be trimmed. On the other hand, the rest portions of the contact spacers 270 covered by the second hard mask layer 320 remain their thickness. Therefore, as shown in FIG. 23G, the contact spacers 270 have different thicknesses at different regions. For example, as shown in FIGS. 23A, 23G and 23H, portions 274 of the contact spacers 270 in contact with (or lining) the sidewalls of the source/drain contacts 292, 294, 296 (or the conductive layers 290) have a thickness T4; as shown in FIGS. 23G and 23I, portions 292 of the contact spacers 270 in contact with (or lining) the sidewalls of the isolation plugs 330 have a thickness T3. The thickness T4 is greater than the thickness T3. Further, a width W2 of the isolation plug 330 in the X direction is greater than a width W3 of the source/drain contacts 292, 294, 296 (or the conductive layers 290) in the X direction. Moreover, as shown in FIG. 23I, the bottom surface 333 of the isolation plug 330 in contact with the mask layer 170 is lower than a bottom surface 278 of the contact spacer 270 in contact with the mask layer 170.

Figure 24:
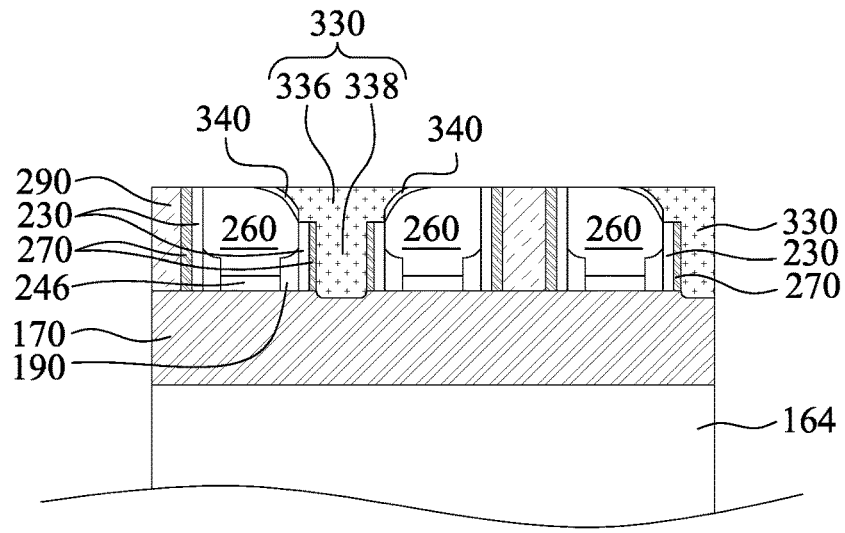
FIG. 24 is a cross-sectional view of a semiconductor device (or an integrated circuit structure) in accordance with some embodiments of the present disclosure.

FIG. 24 is a cross-sectional view of a semiconductor device (or an integrated circuit structure) 100a in accordance with some embodiments of the present disclosure. The difference between the semiconductor device 100a in FIG. 24 and the semiconductor device 100 in FIG. 23C pertains to the shape of the isolation plug 330. In some embodiments, during the CMP process as mentioned in FIG. 23A, top portions of the CESL 230, the dielectric caps 260, the contact spacers 270, the conductive layers 290 (the source/drain contacts 292, 294, 296), and the isolation plugs 330 are not removed, such that each of the isolation plugs 330 has a tapered shape in the cross-sectional view. Specifically, the isolation plug 330 has a top portion 336 and a bottom portion 338. The top portion 336 is wider than the bottom portion 338 and has a tapered shape. The bottom portion 338 is surrounded by the contact spacers 270, and the top portion 336 covers the contact spacers 270 and the CESL 230. Further, the top portion 336 covers portions of the dielectric caps 260. That is, parts of the top portion 336 are directly above the dielectric caps 260.

In some embodiments, when the openings O3 are formed as shown in FIG. 22B, oxide layers (native oxides) 340 are formed on the exposed surfaces of the dielectric caps 260. As such, when the isolation materials are filled in the openings O3, the isolation materials cover the oxide layers 340. As shown in FIG. 24, the oxide layers 340 are sandwiched between the dielectric cap 260 and the isolation plug 330. Further, the oxide layers 340 are in contact with the top portions 336 and are spaced apart from the bottom portions 338 of the isolation plugs 330. Other features of the semiconductor device 100a are similar to those of the semiconductor device 100 shown in FIG. 23C, and therefore, a description in this regard will not be provided hereinafter.

Figure 25:
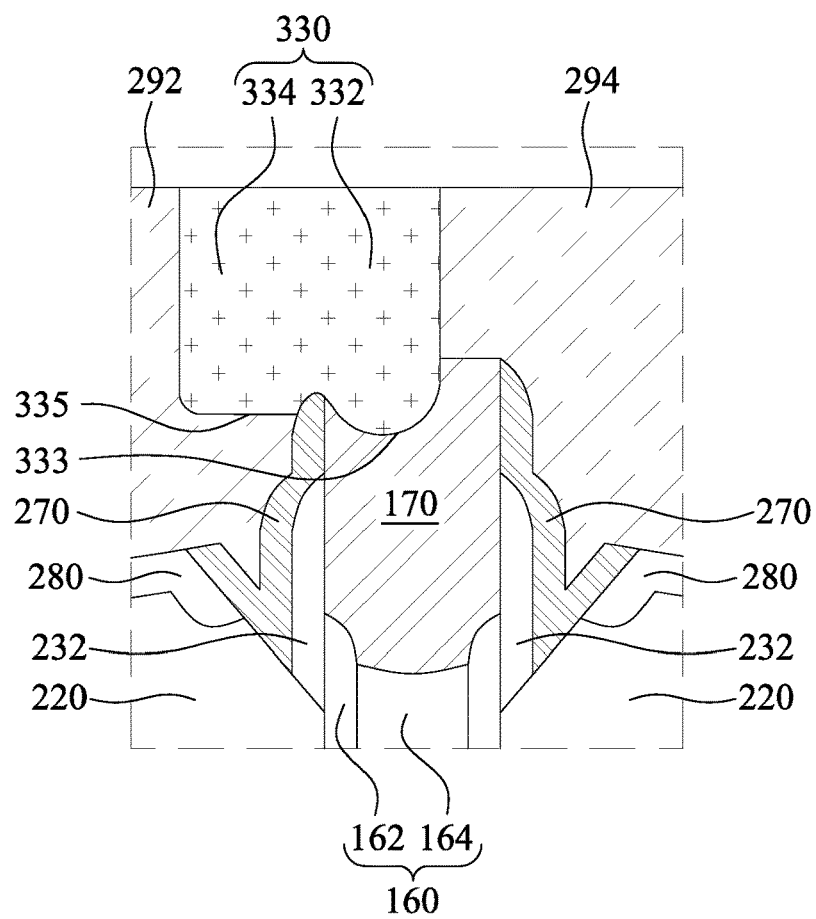
FIG. 25 is a cross-sectional view of a semiconductor device (or an integrated circuit structure) in accordance with some embodiments of the present disclosure.

FIG. 25 is an enlarged cross-sectional view of a semiconductor device (or an integrated circuit structure) 100b in accordance with some embodiments of the present disclosure. The difference between the semiconductor device 100b in FIG. 25 and the semiconductor device 100 in FIG. 23F pertains to the shape of the isolation plug 330. In some embodiments, during the formation of the openings O3 (see FIG. 22B), the etchant used to etch the conductive layers 290 etches the mask layer 170 faster than etches the contact spacers 230 and/or the conductive layers 290. As such, the bottom surface 333 of the first portion 332 is lower than the bottom surface 335 of the second portion 334. Other features of the semiconductor device 100b are similar to those of the semiconductor device 100 shown in FIG. 23F, and therefore, a description in this regard will not be provided hereinafter.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the size of the isolation plug can be small since the isolation plug is formed after the formation of the source/drain contacts, and thus the size of the source/drain contacts can be enlarged. Another advantage is that a portion of the source/drain contact is directly under the isolation plug, such that the source/drain contact still can provide good conductivity even with a large-sized isolation plug. In addition, forming the isolation plug over the mask layer results in a low-aspect-ratio opening formed in the conductive layer for filling the isolation plug.

According to some embodiments, a device includes a channel layer, a gate structure, a first source/drain epitaxial structure, a second source/drain epitaxial structure, a dummy fin structure, a mask layer, a first source/drain contact, and an isolation plug. The gate structure crosses the channel layer. The first source/drain epitaxial structure and the second source/drain epitaxial structure are on opposite sides of the channel layer. The dummy fin structure is in contact with the first source/drain epitaxial structure. The mask layer is over the dummy fin structure. The first source/drain contact is over and electrically connected to the first source/drain epitaxial structure. The isolation plug is over the mask layer and in contact with the first source/drain contact. The isolation plug is directly over the first source/drain contact and the mask layer.

According to some embodiments, a device includes a first source/drain epitaxial structure, a second source/drain epitaxial structure, a semiconductor layer, a gate structure, a source/drain contact, an isolation plug, and a contact spacer. The first source/drain epitaxial structure and the second source/drain epitaxial structure are over a substrate. The semiconductor layer is between the first source/drain epitaxial structure and the second source/drain epitaxial structure. The gate structure covers the semiconductor layer. The source/drain contact is over the first source/drain epitaxial structure. The isolation plug is in contact with a sidewall of the source/drain contact. The contact spacer includes a first portion and a second portion. The first portion lines a sidewall of the isolation plug and having a first thickness. A bottom surface of the first portion is higher than a bottom surface of the isolation plug in a cross-sectional view. The second portion lines a sidewall of the source/drain contact and has a second thickness greater than the first thickness in a top view.

According to some embodiments, a method includes forming a fin structure over a substrate, wherein the fin structure comprises first semiconductor layers and second semiconductor layers alternately stacked; forming a dummy gate structure over the fin structure; removing a portion of the fin structure uncovered by the dummy gate structure; growing a source/drain epitaxial structure on a side of remaining portions of the second semiconductor layers; forming an interlayer dielectric (ILD) layer over the source/drain epitaxial structure and surrounding the dummy gate structure; replacing the dummy gate structure and the first semiconductor layers with a metal gate structure; removing the ILD layer to expose the source/drain epitaxial structure; after removing the ILD layer, forming a conductive layer over the source/drain epitaxial structure; forming an opening in the conductive layer to cut the conductive layer into a first source/drain contact over the source/drain epitaxial structure and a second source/drain contact; and forming an isolation plug in the opening and between the first source/drain contact and the second source/drain contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a fin structure over a substrate, wherein the fin structure comprises first semiconductor layers and second semiconductor layers alternately stacked;
forming a dummy gate structure over the fin structure;
removing a portion of the fin structure uncovered by the dummy gate structure;
growing a source/drain epitaxial structure on a side of remaining portions of the second semiconductor layers;
forming an interlayer dielectric (ILD) layer over the source/drain epitaxial structure and surrounding the dummy gate structure;
replacing the dummy gate structure and the first semiconductor layers with a metal gate structure;
removing the ILD layer to expose the source/drain epitaxial structure;
after removing the ILD layer, forming a conductive layer over the source/drain epitaxial structure;
forming an opening in the conductive layer to cut the conductive layer into a first source/drain contact over the source/drain epitaxial structure and a second source/drain contact, wherein the first source/drain contact is electrically connected to the second source/drain contact prior to forming the opening; and
forming an isolation plug in the opening and between the first source/drain contact and the second source/drain contact, wherein a portion of the first source/drain contact is in contact with a bottom surface of the isolation plug.

2. The method of claim 1, further comprising:
forming a dummy fin structure over the substrate; and
forming a mask layer over the dummy fin structure prior to forming the dummy gate structure.

3. The method of claim 2, wherein forming the opening in the conductive layer is such that the opening exposes the mask layer.

4. The method of claim 2, wherein forming the opening in the conductive layer comprises recessing the mask layer.

5. The method of claim 2, further comprising depositing a contact spacer covering the mask layer and the source/drain epitaxial structure prior to forming the conductive layer over the source/drain epitaxial structure.

6. The method of claim 5, wherein forming the opening in the conductive layer comprises removing a portion of the contact spacer over the mask layer and another portion of the contact spacer remains on a sidewall of the mask layer.

7. The method of claim 1, further comprising forming a contact spacer lining a sidewall of the metal gate structure after removing the ILD layer and prior to forming the conductive layer.

8. A method comprising:
providing a semiconductor structure comprising:
a substrate; and
a first transistor and a second transistor over the substrate;
removing an interlayer dielectric layer over the first transistor and the second transistor to form a recess exposing a first source/drain epitaxial structure of the first transistor and a second source/drain epitaxial structure of the second transistor;
after removing the interlayer dielectric layer, forming a first metal alloy layer on the first source/drain epitaxial structure;
after removing the interlayer dielectric layer, forming a second metal alloy layer on the second source/drain epitaxial structure;
depositing a conductive layer in the recess, over the first source/drain epitaxial structure and the second source/drain epitaxial structure, and in contact with the first metal alloy layer and the second metal alloy layer;
performing an etching process to the conductive layer to cut the conductive layer into a first source/drain contact connecting the first metal alloy layer and a second source/drain contact connecting the second metal alloy layer;
forming an isolation structure between the first source/drain contact and the second source/drain contact; and
forming a contact spacer lining a sidewall of the recess after removing the interlayer dielectric layer and prior to forming the first metal alloy layer.

9. The method of claim 8, wherein the contact spacer further lines an outer surface of the first source/drain epitaxial structure.

10. The method of claim 8, wherein a portion of the contact spacer is at a level below the first metal alloy layer.

11. The method of claim 8, wherein the etching process is performed to remove a portion of a dielectric cap over a gate structure of the first transistor.

12. The method of claim 8, wherein a portion of the first source/drain contact is in contact with a bottom surface of the isolation structure.

13. The method of claim 8, wherein the conductive layer extends from the first metal alloy layer to the second metal alloy layer.

14. A method comprising:
forming a first channel structure and a second channel structure over a substrate;
forming a mask layer between the first channel structure and the second channel structure;
forming a dummy gate structure over the first channel structure, the second channel structure, and the mask layer;
forming a first source/drain epitaxial structure over the substrate and connected to the first channel structure;
forming a second source/drain epitaxial structure over the substrate and connected to the second channel structure;
depositing an interlayer dielectric layer over the first source/drain epitaxial structure, the second source/drain epitaxial structure, and the mask layer;
replacing the dummy gate structure with a metal gate structure;
removing the interlayer dielectric layer;

depositing a conductive layer over the first source/drain epitaxial structure, the second source/drain epitaxial structure, and the mask layer, wherein the conductive layer is in contact with a top surface of the mask layer; and forming an isolation structure in the conductive layer and in contact with the mask layer.

15. The method of claim 14, further comprising forming a contact spacer over the first source/drain epitaxial structure, the second source/drain epitaxial structure, and the mask layer after removing the interlayer dielectric layer and prior to depositing the conductive layer.

16. The method of claim 15, wherein the contact spacer is in contact with a sidewall of the mask layer.

17. The method of claim 14, wherein the isolation structure is misaligned with the mask layer.

18. The method of claim 14, wherein forming the isolation structure comprises:

forming an opening in the conductive layer and exposes the mask layer;

depositing a dielectric material in the opening; and removing a portion of the dielectric material outside the opening.

19. The method of claim 18, wherein forming the opening in the conductive layer comprises etching a top portion of the mask layer.

20. The method of claim 14, wherein after forming the isolation structure, a portion of the conductive layer is in contact with a top surface of the mask layer.

* * * * *